(12) United States Patent
Yukinobu et al.

(10) Patent No.: US 9,040,119 B2
(45) Date of Patent: May 26, 2015

(54) METHOD FOR PRODUCING TRANSPARENT CONDUCTIVE FILM, TRANSPARENT CONDUCTIVE FILM, TRANSPARENT CONDUCTIVE SUBSTRATE AND DEVICE COMPRISING THE SAME

(75) Inventors: Masaya Yukinobu, Chiba (JP); Yoshihiro Otsuka, Chiba (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 675 days.

(21) Appl. No.: 12/998,767

(22) PCT Filed: Dec. 1, 2009

(86) PCT No.: PCT/JP2009/070442
§ 371 (c)(1),
(2), (4) Date: May 31, 2011

(87) PCT Pub. No.: WO2010/064719
PCT Pub. Date: Jun. 10, 2010

(65) Prior Publication Data
US 2011/0229737 A1  Sep. 22, 2011

(30) Foreign Application Priority Data

Dec. 1, 2008 (JP) ................. 2008-306883
Jun. 9, 2009 (JP) ................. 2009-138643
Oct. 14, 2009 (JP) ................. 2009-237704

(51) Int. Cl.
*B05D 3/02* (2006.01)
*B05D 5/12* (2006.01)
*H01L 31/18* (2006.01)
*C23C 18/12* (2006.01)
*H01L 33/42* (2010.01)
*G02F 1/1343* (2006.01)

(52) U.S. Cl.
CPC ........ *H01L 31/1884* (2013.01); *C23C 18/1216* (2013.01); *C23C 18/1275* (2013.01); *C23C 18/1279* (2013.01); *C23C 18/1283* (2013.01); *G02F 1/13439* (2013.01); *H01L 33/42* (2013.01); *Y02E 10/50* (2013.01); *H01L 2924/0002* (2013.01)

(58) Field of Classification Search
USPC ................................... 427/74, 226
See application file for complete search history.

(56) References Cited

U.S. PATENT DOCUMENTS

| | | | |
|---|---|---|---|
| 4,420,500 A | 12/1983 | Nakatani et al. | |
| 4,450,100 A | 5/1984 | Kano et al. | |
| 5,529,720 A * | 6/1996 | Hayashi et al. | 252/519.3 |
| 2002/0012599 A1* | 1/2002 | Hasegawa et al. | 419/19 |
| 2002/0041152 A1* | 4/2002 | Burrows | 313/506 |
| 2002/0087018 A1* | 7/2002 | Celinska et al. | 556/105 |
| 2003/0157250 A1* | 8/2003 | Mukherjee et al. | 427/337 |

FOREIGN PATENT DOCUMENTS

| | | |
|---|---|---|
| JP | 5736714 | 2/1982 |
| JP | 57212268 | 12/1982 |
| JP | 6126679 | 2/1986 |
| JP | 6319046 | 4/1988 |
| JP | 220706 | 5/1990 |
| JP | 4255768 | 9/1992 |
| JP | 06203658 | 7/1994 |
| JP | 6325637 | 11/1994 |

OTHER PUBLICATIONS

Nomura et al. (Thermal decomposition of organoindium compounds and preparation of indium—tin—oxide films) (1987).*
English Abstract of JP61026679.
English Abstract of JP4255768.
English Abstract of JP57212268.

* cited by examiner

*Primary Examiner* — Austin Murata
(74) *Attorney, Agent, or Firm* — Dykema Gossett PLLC

(57) ABSTRACT

Provided is a method for producing a transparent conductive film which is formed via a coating step, a drying step and a baking step, wherein the baking step is characterized in that the dried coating film containing the organic metal compound as the main component is baked by being heated to a baking temperature or higher, at which at least the inorganic component is crystallized, under an oxygen-containing atmosphere having a dewpoint of −10° C. or lower, whereby an organic component contained in the dried coating film is removed therefrom by a heat decomposition, a combustion or the combination thereof to thereby form a conductive oxide microparticle layer densely filled with conductive oxide microparticles containing the metal oxide as a main component.

10 Claims, 8 Drawing Sheets

METHOD FOR PRODUCING TRANSPARENT CONDUCTIVE FILM, TRANSPARENT CONDUCTIVE FILM, TRANSPARENT CONDUCTIVE SUBSTRATE AND DEVICE COMPRISING THE SAME

TECHNICAL FIELD

The present invention relates to a transparent conductive film, and a method for producing the transparent conductive film. Specifically, the present invention relates to a method for producing a transparent conductive film, formed on a heat-resistant substrate such as a glass or ceramic, having both transparency and conductivity, and moreover high film strength; a transparent conductive film obtained by the method for producing a transparent conductive film; a transparent conductive substrate using the transparent conductive film; and a device using the transparent conductive substrate.

BACKGROUND ART

Tin-doped indium oxide (indium tin oxide, hereinafter it may sometimes be referred to as "ITO") is known as a material for forming a transparent conductive film used for transparent electrodes for a display element such as a liquid crystal display, an electroluminescent display or a plasma display; transparent electrodes for a touch panel or a solar cell; or a functional coating for heat reflection, electromagnetic wave-shielding material, antistatic material, or anti-fogging material.

A physical method such as a vacuum deposition method, a sputtering method or a chemical vapor deposition method has been widely used as a method for producing an ITO transparent conductive film. According to these methods, a uniform ITO transparent conductive film having both high transparency and high conductivity can be formed on a substrate.

These methods, however, are very expensive, because a vacuum container-based apparatus is used as a film-forming apparatus in these methods, and pressures of gas components in the production apparatus must be precisely controlled for each film formed on a substrate. Therefore, these methods are problematic in terms of production cost and mass productivity.

As a production method for solving the problems, a method wherein a substrate is coated with a coating liquid for forming a transparent conductive film in which an indium compound and a tin compound are dissolved in a solvent (hereinafter may sometimes be referred to as a "coating method") has been studied.

According to this coating method, an ITO transparent conductive film is formed through simple production steps of coating a substrate with a coating liquid for forming a transparent conductive film, drying it, and baking it. As the coating method for coating a substrate with a coating liquid, an ink jet printing method, a screen printing method, a gravure printing method, an offset printing method, a flexo printing method, a dispenser printing method, a slit coating method, a die coating method, a doctor blade coating method, a wire bar coating method, a spin coating method, dip coating method, a spray coating method, and the like are known.

As a coating liquid used in the coating methods, various coating liquids containing an indium compound and a tin compound have been developed, and for example, a mixed liquid of an indium nitrate containing a halogen ion or a carboxyl group, and an alkyl tin nitrate (see, for example, JP-A-57-138708); a mixture of an organic indium compound containing an alkoxyl group or the like, and an organic tin compound (see, for example, JP-A-61-26679); a mixture of indium nitrate and an organic tin compound (see, for example, JP-A-4-255768); a mixture of inorganic compounds of indium nitrate, tin nitrate and the like (see, for example, JP-A-57-36714); a mixture of an organic indium nitrate such as an indium nitrate dicarboxylate and an organic tin nitrate such as an alkyl tin nitrate (see, for example, JP-A-57-212268); a mixed solution of organic compounds containing an organic indium complex in which acetylacetone is coordinated, and a tin complex (see, for example, JP-B-63-25448, JP-B-2-20706 and JP-B-63-19046), have been disclosed.

Many of these coating liquids which have hitherto been known make use of indium or tin nitrate, an organic or inorganic compound composed of a halide, an organic metal compound such as a metal alkoxide, or the like.

The coating liquid using the nitrate or halide, however, has a problem in which corrosion of equipment and deterioration of environment occur, because a corruptive gas such as nitrogen oxides or chlorine is generated at the time of baking; and the coating liquid using the metal alkoxide has a problem in terms of stability of the coating liquid, because its starting materials are easily hydrolyzed. In addition, many of the coating liquids using the organic metal compound described in Patent Documents, problematically, have poor wettability to a substrate, and likely provide an ununiform film.

As a coating liquid which improves these problems, a coating liquid for forming a transparent conductive film, containing acetylacetone indium (a full name: tris(acetylacetonato)indium: $In(C_5H_7O_2)_3$), acetylacetone tin (a full name: di-n-butyl bis(2,4-pentanedionato)tin: $[Sn(C_4H_9)_2(C_5H_7O_2)_2]$), hydroxypropyl cellulose, an alkyl phenol and/or an alkenyl phenol, and a dibasic acid ester and/or benzyl acetate (see, for example, JP-A-6-203658) is disclosed.

The wettability of this coating liquid to a substrate is improved by containing the hydroxypropyl cellulose in the mixed solution of acetylacetone indium and acetylacetone tin, and, at the same time, the viscosity of the coating liquid is controlled by regulating the content of hydroxypropyl cellulose, which is a viscosity agent, whereby it becomes possible for the coating liquid to be applied to various coating methods such as spin coating, spray coating, dip coating, screen printing and wire bar coating.

As an improved coating liquid for spin coating, a coating liquid for forming a transparent conductive film, containing an organic indium compound such as acetylacetone indium or indium octoate, an organic tin such as acetylacetone tin or tin octoate and an organic solvent, wherein, as the organic solvent, an acetylacetone solution in which an alkyl phenol and/or an alkenyl phenol is dissolved, or an acetylacetone solution in which an alkyl phenol and/or an alkenyl phenol is dissolved, the solution being diluted with an alcohol, is used (see, for example, JP-A-6-325637), is proposed.

This coating liquid has a low viscosity, and in addition to spin coating, can be also used in spray coating or dip coating.

SUMMARY OF THE INVENTION

Technical Problem

In transparent conductive films formed by coating substrates with such various ITO coating liquids for forming a transparent conductive film, drying them and baking them, however, ITO microparticles formed in the course of transformation of an organic indium compound in the coating liquid into an ITO film by heat decomposition or combustion (oxidation) at the time of baking, are difficult to be densified, and therefore the resulting transparent conductive films have defects such as an insufficient conductivity and a low film strength. Consequently, transparent conductive films having higher conductivity or film strength are desired for applying the films to a transparent electrode for a display, a touch panel or a solar cell.

The present invention aims at providing a transparent conductive film having both a high transparency and a high conductivity, and further a high film strength, formed using an ink coating method which is a low-cost and simple method for producing a transparent conductive film; a method for producing this transparent conductive film, and a transparent conductive film and a transparent conductive substrate, which are obtained by the production method; and a device using the same.

Solution to Problem

In view of these problems, the present inventors have repeated painstaking studies concerning a transparent conductive film containing anyone or more of indium oxide, tin oxide and zinc oxide as a main component, which is obtained by coating a heat-resistant substrate with a coating liquid for forming a transparent conductive film, containing an organic metal compound made up of any one or more of an organic indium compound, an organic tin compound and an organic zinc compound, drying the coating film, and baking the dried film.

As a result, they have invented a transparent conductive film having both a high transparency and a high conductivity, and further a high film strength by adopting an air atmosphere having a low dewpoint, i.e., a low water vapor content in the course of temperature elevation at the time of baking to inhibit crystal growth of a conductive oxide in an early stage of baking, whereby a conductive oxide microparticle layer having a film structure that is densely filled with conductive oxide microparticles can be obtained.

That is, a first aspect of the present invention is a method for producing a transparent conductive film, containing the steps of: coating a heat-resistant substrate with a coating liquid for forming a transparent conductive film, containing an organic metal compound as a main component to form a coating film; drying the coating film to form a dried coating film; and baking the dried coating film to form an inorganic film containing an inorganic component being a metal oxide as a main component, wherein the baking step is a step in which the dried coating film containing the organic metal compound as the main component, having been formed in the drying step described above, is baked by being heated to a baking temperature or higher, at which at least the inorganic component is crystallized, under an oxygen-containing atmosphere having a dewpoint of $-10°$ C. or lower, whereby an organic component contained in the dried coating film is removed therefrom by a heat decomposition, a combustion or the combination thereof to thereby form a conductive oxide microparticle layer densely filled with conductive oxide microparticles containing the metal oxide as a main component; the organic metal compound is made up of any one or more of organic indium compounds, organic tin compounds and organic zinc compounds; and the metal oxide is any one or more of the oxides selected from indium oxide, tin oxide and zinc oxide.

A second aspect of the present invention is a method for producing a transparent conductive film, containing the steps of: coating a heat-resistant substrate with a coating liquid for forming a transparent conductive film, containing an organic metal compound as a main component and an organic metal compound for a dopant to form a coating film; drying the coating film to form a dried coating film; and baking the dried coating film to form an inorganic film containing an inorganic component being a metal oxide containing a dopant metal compound as a main component, wherein the baking step is a step in which the dried coating film containing the organic metal compound and the organic metal compound for a dopant as the main component, having been formed in the drying step described above, is baked by being heated to a baking temperature or higher, at which at least the inorganic component is crystallized, under an oxygen-containing atmosphere having a dewpoint of $-10°$ C. or lower, whereby an organic component contained in the dried coating film is removed therefrom by a heat decomposition, a combustion or the combination thereof to thereby form a conductive oxide microparticle layer densely filled with conductive oxide microparticles containing the metal oxide as a main component and the dopant metal compound; the organic metal compound is made up of any one or more of organic indium compounds, organic tin compounds and organic zinc compounds, and the metal oxide is any one or more of the oxides selected from indium oxide, tin oxide and zinc oxide.

A third aspect of the present invention is the method for producing a transparent conductive film according to the second aspect, wherein the content ratio of the organic metal compound to the organic metal compound for a dopant is within the range of 99.9:0.1 to 66.7:33.3 in terms of a molar ratio of the organic metal compound:the organic metal compound for a dopant.

A fourth aspect of the present invention is the method for producing a transparent conductive film according to the second or third aspect, wherein the organic metal compound is the organic indium compound; the organic metal compound for a dopant is any one or more of organic tin compounds, organic titanium compounds, organic germanium compounds, organic zinc compounds, organic tungsten compounds, organic zirconium compounds, organic tantalum compounds, organic niobium compounds, organic hafnium compounds and organic vanadium compounds; and the dopant metal compound is any one or more of tin oxide, titanium oxide, germanium oxide, zinc oxide, tungsten oxide, zirconium oxide, tantalum oxide, niobium oxide, hafnium oxide and vanadium oxide.

A fifth aspect of the present invention is the method for producing a transparent conductive film according to the second or third aspect, wherein the organic metal compound is made up of the organic tin compound; and the organic metal compound for a dopant is any one or more of organic indium compounds, organic antimony compounds and organic phosphorous compounds.

A sixth aspect of the present invention is the method for producing a transparent conductive film according to the second or third aspect, wherein the organic metal compound is made up of the organic zinc compound; and the organic metal compound for a dopant is any one or more of organic aluminum compounds, organic indium compounds and organic gallium compounds.

A seventh aspect of the present invention is the method for producing a transparent conductive film according to any of the first to sixth aspects, wherein the organic indium compound is acetylacetone indium.

An eighth aspect of the present invention is the method for producing a transparent conductive film according to the first or second aspect, wherein subsequent to the baking by being heated to a baking temperature or higher, at which at least the inorganic component is crystallized, under an oxygen-containing atmosphere having a dewpoint of $-10°$ C. or lower, the resulting film is baked at a baking temperature of 300° C. or higher under an oxygen-containing atmosphere having a dewpoint of 0° C. or higher.

A ninth aspect of the present invention is the method for producing a transparent conductive film according to the first or second aspect, wherein subsequent to the baking by being heated to a baking temperature or higher, at which at least the inorganic component is crystallized under the oxygen-containing atmosphere having the dewpoint of −10° C. or lower, baking is performed at a baking temperature of 250° C. or higher under a neutral atmosphere or a reducing atmosphere.

A tenth aspect of the present invention is the method for producing a transparent conductive film according to the eighth aspect, wherein subsequent to the baking at the baking temperature of 300° C. or higher, under the oxygen-containing atmosphere having the dewpoint of 0° C. or higher, baking is performed at a baking temperature of 250° C. or higher under a neutral atmosphere or a reducing atmosphere.

An eleventh aspect of the present invention is the method for producing a transparent conductive film according to the ninth or tenth aspect, wherein the neutral atmosphere is an atmosphere containing any one or more of nitrogen gas and inert gases, or the reducing atmosphere is an atmosphere containing hydrogen gas or an atmosphere in which any one or more of hydrogen gas and vapors of organic solvents are contained in the neutral atmosphere.

A twelfth aspect of the present invention is the method for producing a transparent conductive film according to any of the first to eleventh aspects, wherein the dewpoint in the baking under the oxygen-containing atmosphere having the dewpoint of −10° C. or lower is −20° C. or lower.

A thirteenth aspect of the present invention is the method for producing a transparent conductive film according to the first or second aspect, wherein the method for coating the heat-resistant substrate with the coating liquid for forming a transparent conductive film in the coating step is any of an ink jet printing method, a screen printing method, a gravure printing method, an offset printing method, a flexo printing method, a dispenser printing method, a slit coating method, a die coating method, a doctor blade coating method, a wire bar coating method, a spin coating method, a dip coating method and a spray coating method.

A fourteenth aspect of the present invention is a transparent conductive film which is obtained by the method for producing a transparent conductive film according to any one of the first to thirteenth aspects.

A fifteenth aspect of the present invention is a transparent conductive substrate containing a heat-resistant substrate provided with a transparent conductive film thereon, wherein the transparent conductive film is the transparent conductive film according to the fourteenth aspect.

A sixteenth aspect of the present invention is a device provided with a transparent electrode, wherein the transparent electrode is the transparent conductive substrate according to the fifteenth aspect.

A seventeenth aspect of the present invention is the device according to the sixteenth aspect, wherein the device is one selected from a light emitting device, an electric power-generating device, a display device and an input device.

Advantageous Effects of Invention

According to the method for producing a transparent conductive film of the present invention, a conductive oxide microparticle layer that is densely filled with conductive oxide microparticles containing a metal oxide as a main component is formed, and therefore the resulting transparent conductive film has both an excellent transparency and a high conductivity, and further has a high film strength. As a result, a transparent conductive substrate in which this transparent conductive film is formed on a heat-resistant substrate is suitable for use in light emitting devices such as an LED element, an electroluminescent lamp (an electroluminescent element) and a field emission lamp; electric power-generating devices such as a solar cell; display devices such as an liquid crystal display (liquid crystal elements), an electroluminescent display (electroluminescent elements), a plasma display and an electronic paper element; input devices such as a touch panel, and the like.

DESCRIPTION OF EMBODIMENTS

Figure 1:
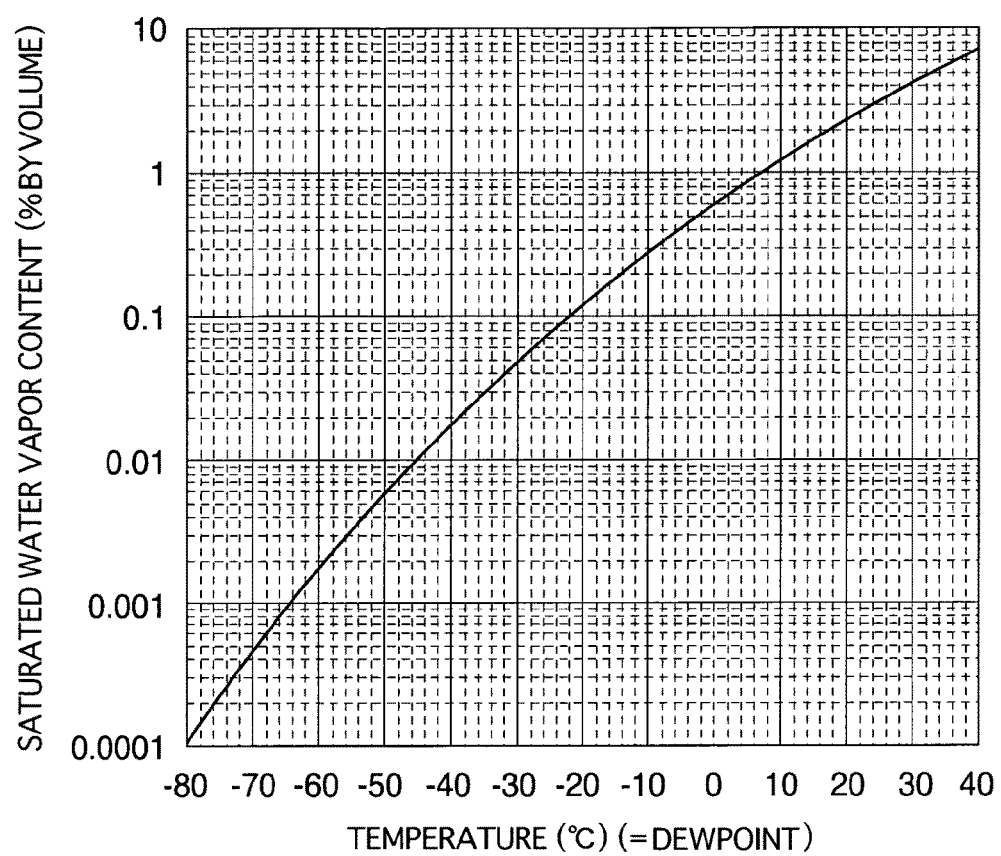
FIG. 1 is a chart showing a relationship between a saturated water vapor content (% by volume) in the air and a dewpoint (° C.)

Examples of the present invention will be explained in detail below.

According to the present invention, in a method for producing a transparent conductive film containing the steps of coating a heat-resistant substrate with a coating liquid for forming a transparent conductive film, containing an organic metal compound as a main component, drying the coating film, and baking the dried coating film, the crystal growth of conductive oxide microparticles containing a metal oxide as a main component proceeds, and a conductive oxide microparticle layer that is densely filled with the microparticles is formed, and therefore the conductivity and the film strength of the transparent conductive film can be improved.

[Transparent Conductive Film Structure]

First, the structure of the transparent conductive film will be explained.

The explanation is made taking a transparent conductive film of tin-doped indium oxide (ITO) for instance, but the same holds true for a transparent conductive film containing, as a main component, an oxide other than the indium oxide, such as tin oxide or zinc oxide.

For example, when a transparent conductive film made up of ITO is formed by using a vapor phase growth method such as a sputtering method, a polycrystalline ITO film structure in which ITO crystal grains are arranged through a grain boundary is generally formed, and therefore the ITO microparticles are hardly observed in the film structure.

A transparent conductive film made up of ITO, which is formed by a coating method containing the steps of coating a heat-resistant substrate with a coating liquid for forming a transparent conductive film, containing an organic indium compound and a organic tin compound as main components, drying the coating film, and baking the dried coating film, has usually a film structure in which ITO microparticles are bonded to each other. Although a particle size of the ITO microparticles and a size of pores between the ITO microparticles vary depending on the baking conditions and the like, it is known that such a film is a transparent conductive film made up of ITO microparticles having quite a lot of open pores.

As electric conduction of the transparent conductive film in which the ITO microparticles are bonded to each other, formed by this coating method, is performed through contact points (bonded parts) of the ITO microparticles, the conductivity decreases at the contact points, which can be considered to be caused by contact of the ITO microparticles with each other in a very small area; the conductivity is reduced with time under exposure to air, which can be considered to be caused by entry of oxygen and water vapor in the air through the open pores, which leads to deterioration of contact of the ITO microparticles with each other; and the film strength is reduced, which can be considered to be caused by the ITO microparticles sparsely filled.

In contrast to such conventional techniques, according to the present invention, the conductive oxide microparticles are densely filled and, at the same time, the crystal growth of the conductive oxide microparticles is promoted, thereby forming a film structure having a conductive oxide microparticle layer containing any one or more of the oxides selected from indium oxide, tin oxide and zinc oxide, which has a few open pores, which is dense, and which has enhanced contact between the conductive oxide microparticles. By such a film structure, the improvement of the conductivity is attempted, and also the improvement of the film strength is attained. Moreover, it is possible to remarkably inhibit the reduction of the conductivity with time.

That is, in the present invention, the dense conductive oxide microparticle layer containing any one or more of the oxides selected from indium oxide, tin oxide and zinc oxide as the main component is formed by employing an oxygen-containing atmosphere having a low water vapor content (i.e., a low dewpoint) in the course of temperature elevation at the time of baking in the coating method using the coating liquid for forming a transparent conductive film as described above.

Although the mechanism for forming such a dense conductive oxide microparticle layer is not clarified yet, as a detailed explanation is made below, the point can be assumed that when water vapor exists in an oxygen-containing atmosphere, the crystallization and the crystal growth of a conductive oxide, generated by heat decomposition or combustion of the organic metal compound of any one or more of organic indium compounds, organic tin compounds and organic zinc compounds, is promoted by the water vapor, whereby the conductive oxide microparticles adhere to each other and are not movable, at the initial stage of the baking step in which the heat decomposition or combustion is performed, thus resulting in inhibition of densification of the conductive oxide microparticles.

For example, when the oxygen-containing atmosphere having a low water vapor content, i.e., or a low dewpoint used in the present invention is applied to production of a transparent conductive film containing an indium oxide as a main component, it is possible to increase a packing density of the conductive oxide microparticles in the transparent conductive film to about 90% of the true specific gravity of the conductive oxide, whereas when an oxygen-containing atmosphere containing water vapor is applied to the production of the film, the packing density is only about 60 to 70% of the true specific gravity.

[Coating Liquid for Forming Transparent Conductive Film]

Next, the coating liquid for forming a transparent conductive film used in the present invention will be explained in detail.

According to the present invention, the transparent conductive film containing any one or more of the oxides selected from indium oxide, tin oxide and zinc oxide as the main component is formed by using the coating liquid for forming a transparent conductive film containing any one or more of the organic metal compounds of the organic indium compound, the organic tin compound and the organic zinc compound as the main component. It is generally desirable for the transparent conductive film to have a higher conductivity, and, in such a case, the conductivity is improved by doping, to the main oxide component such as indium oxide, tin oxide or zinc oxide, a metal compound other than the main oxide, primarily a metal oxide. That is, when the indium oxide, the tin oxide or the zinc oxide containing the dopant metal compound is used as the conductive oxide, the conductivity of the transparent conductive film is improved. This is caused because the dopant metal compound serves to increase a concentration of electrons, which are carriers, (carrier density) in the conductive oxide.

The concrete doping method includes a method in which the organic metal compound for a dopant is added to the coating liquid for forming a transparent conductive film containing any one or more of the organic metal compounds of the organic indium compound, the organic tin compound and the organic zinc compound as the main component in a predetermined amount.

First, the coating liquid for forming a transparent conductive film containing the organic indium compound as the main component will be explained below.

The organic indium compound used in the present invention includes acetylacetone indium (a full name: tris(acetylacetonato)indium) [$In(C_5H_7O_2)_3$], indium 2-ethylhexanoate, indium formate, indium alkoxide, and the like, and basically organic indium compounds capable of dissolving in a solvent and being decomposed into the oxide without generation of harmful gas such as chlorine gas or nitrogen oxide gas at the time of baking, may be used. Among these, acetylacetone indium is preferable, because it has a high solubility in an organic solvent, and is heat-decomposed or combusted (oxidized) at a temperature of about 200 to 250° C. into the oxide.

As the organic metal compound for a dopant improving the conductivity, any one or more of the organic tin compounds, the organic titanium compounds, the organic germanium compounds, the organic zinc compounds, the organic tungsten compounds, the organic zirconium compounds, the organic tantalum compounds, the organic niobium compounds, the organic hafnium compounds and the organic vanadium compounds are preferable.

Some devices using the transparent conductive film may require a rather low conductivity, and therefore the addition of the organic metal compound for a dopant to the coating liquid for forming a transparent conductive film may be performed from time to time, as occasion demands.

The organic tin compound (a valence of the tin in the compound is not limited to divalence or tetravalence) for the organic metal compound for a dopant includes, for example, acetylacetone tin (a full name: di-n butyl bis(2,4-pentanedionato)tin, [$Sn(C_4H_9)_2(C_5H_7O_2)_2$], tin octoate, tin 2-ethylhexanoate, tin (II) acetate [$Sn(CH_3COO)_2$], tin (IV) acetate [$Sn(CH_3COO)_4$], di-n-butyl tin diacetate [$Sn(C_4H_9)_2(CH_3COO)_2$], tin formate, a tin alkoxide such as tin-tert-butoxide [$Sn(C_4H_9O)_4$] and the like, and basically organic tin compounds capable of dissolving in a solvent and being decomposed into the oxide without generation of harmful gas such as chlorine gas or nitrogen oxide gas at the time of baking, may be used. Among these, the acetylacetone tin is preferable, because it can be easily obtained at a relatively low price.

The organic titanium compound for the organic metal compound for dopant includes, for example, a titanium acetylacetone complex such as acetylacetone titanium (a full name: titanium di-n-butoxide bis(2,4-pentanedionate) [$Ti(C_4H_9O)_2(C_5H_7O_2)_2$]), titanyl (IV) acetylacetonate [$(C_5H_7O_2)4TiO$], or titanium diisopropoxide bis(2,4-pentanedionate) [$C_{16}H_{36}O_4Ti$]; a titanium alkoxide such as titanium tetraethoxide [$Ti(C_2H_5O)_4$], titanium (IV)-tert-butoxide [$Ti(C_4H_9O)_4$], titanium tetra-n-butoxide [$Ti(C_4H_9O)_4$], or titanium tetraisopropoxide [$Ti(C_3H_7O)_4$], and the like, and basically organic titanium compounds capable of dissolving in a solvent and being decomposed into the oxide without generation of harmful gas such as chlorine gas or nitrogen oxides gas at the time of baking, may be used. Among these, the acetylacetone titanium, the titanium tetra-n-butoxide, and the titanium tetraisopropoxide are preferable, because they are easily obtained at a low price.

The organic germanium compound for the organic metal compound for a dopant includes, for example, a germanium alkoxide such as germanium tetraethoxide [$Ge(C_2H_5O)_4$], germanium tetra-n-butoxide [$Ge(C_4H_9O)_4$] or germanium tetraisopropoxide [$Ge(C_3H_7O)_4$]; β-carboxyethylgermanium oxide [$(GeCH_2CH_2COOH)_2O_3$], tetraethyl germanium [$Ge(C_2H_5)_4$], tetrabutyl germanium [$Ge(C_4H_9)_4$], tributyl germanium [$Ge(C_4H_9)_3$], and the like, and basically organic germanium compounds capable of dissolving in a solvent and being decomposed into the oxide without generation of harmful gas such as chlorine gas or nitrogen oxide gas at the time of baking, may be used. Among these, the germanium tetraethoxide, the germanium tetra-n-butoxide, and the germanium tetraisopropoxide are preferable, because they are easily obtained at a relatively low price.

The organic zinc compound for the organic metal compound for a dopant includes, for example, a zinc acetylacetone complex such as acetylacetone zinc (a full name: zinc-2,4-pentanedionate) [$Zn(C_5H_7O_2)_2$], or zinc-2,2,6,6-tetramethyl-3,5-heptanedionate [$Zn(C_{11}H_{19}O_2)_2$], and the like, and basically organic zinc compounds capable of dissolving in a solvent and being decomposed into the oxide without generation of harmful gas such as chlorine gas or nitrogen oxide gas at the time of baking, may be used. Among these, the acetylacetone zinc is preferable because it is easily obtained at a low price.

The organic tungsten compound for the organic metal compound for a dopant includes, for example, a tungsten alkoxide such as tungsten (V) ethoxide [$W(C_2H_5O)_5$], or tungsten (VI) ethoxide [$W(C_2H_5O)_6$], and the like, and basically organic tungsten compounds capable of dissolving in a solvent and being decomposed into the oxide without generation of harmful gas such as chlorine gas or nitrogen oxide gas at the time of baking, may be used.

The organic zirconium compound for the organic metal compound for a dopant includes, for example, a zirconium acetylacetone complex such as zirconium di-n-butoxide bis (2,4-pentanedionate) [$Zr(C_4H_9O)_2(C_5H_7O_2)_2$]) or acetylacetone zirconium (a full name: zirconium-2,4-pentanedionate) [$Zr(C_5H_7O_2)_4$], a zirconium alkoxide such as zirconium ethoxide [$Zr(C_2H_5O)_4$], zirconium-n-propoxide [$Zr(C_3H_7O)_4$], zirconium isopropoxide [$Zr(C_3H_7O)_4$], zirconium-n-butoxide [$Zr(C_4H_9O)_4$], zirconium-tert-butoxide [$Zr(C_4H_9O)_4$], zirconium-2-methyl-2-butoxide [$Zr(C_5H_{11}O)_4$] or zirconium-2-methoxymethyl-2-propoxide [$Zr(C_5H_{11}O_2)_4$], and the like, and basically organic zirconium compounds capable of dissolving in a solvent and being decomposed into the oxide without generation of harmful gas such as chlorine gas or nitrogen oxide gas at the time of baking, may be used. Among these, the zirconium-n-propoxide and the zirconium-n-butoxide are preferable because they are easily obtained at a low price.

The organic tantalum compound for the organic metal compound for a dopant includes, for example, a tantalum acetylacetone complex such has tantalum (V) tetraethoxide-pentanedionate [$Ta(C_5H_7O_2)(OC_2H_5)_4$], a tantalum alkoxide such as tantalum methoxide [$Ta(CH_3O)_5$], tantalum ethoxide [$Ta(C_2H_5O)_5$], tantalum isopropoxide [$Ta(C_3H_7O)_5$], tantalum-n-butoxide [$Ta(C_4H_9O)_5$], tantalum tetraethoxyacetylacetonate [$Ta(C_2H_5O)_4(C_5H_7O_2)$], and the like, and basically organic tantalum compounds capable of dissolving in a solvent and being decomposed into the oxide without generation of harmful gas such as chlorine gas or nitrogen oxide gas at the time of baking, may be used.

The organic niobium compound for the organic metal compound for a dopant includes, for example, a niobium alkoxide such as niobium ethoxide [$Nb(C_2H_5O)_5$] or niobium-n-butoxide [$Nb(C_4H_9O)_5$], and the like, and basically organic niobium compounds capable of dissolving in a solvent and being decomposed into the oxide without generation of harmful gas such as chlorine gas or nitrogen oxide gas at the time of baking, may be used.

The organic hafnium compound for the organic metal compound for a dopant includes, for example, a hafnium acetylacetone complex such as hafnium di-n-butoxide bis(2,4-pentanedionate) [$Hf(C_4H_9O)_2(C_5H_7O_2)_2$]) or acetylacetone hafnium (a full name: hafnium-2,4-pentanedionate) [$Hf(C_5H_7O_2)_4$], a hafnium alkoxide such as hafnium ethoxide [$Hf(C_2H_5O)_4$], hafnium-n-butoxide [$Hf(C_4H_9O)_4$], hafnium-tert-butoxide [$Hf(C_4H_9O)_4$], or hafnium (VI) isopropoxide monoisopropylate [$Hf(C_3H_7O)_4(C_3H_7OH)$], and the like, and basically organic hafnium compounds capable of dissolving in a solvent and being decomposed into the oxide without generation of harmful gas such as chlorine gas or nitrogen oxide gas at the time of baking, may be used. Among these, the hafnium-n-butoxide is preferable because it is easily obtained at a relatively low price.

The organic vanadium compound for the organic metal compound for a dopant includes, for example, a vanadium acetylacetone complex such as vanadium (IV) oxide bis-2,4-pentanedionate [$VO(C_5H_7O_2)_2$] or acetylacetone vanadium (a full name: vanadium (III)-2,4-pentanedionate) [$V(C_5H_7O_2)_3$], and the like, and basically organic vanadium compounds capable of dissolving in a solvent and being decomposed into the oxide without generation of harmful gas such as chlorine gas or nitrogen oxide gas at the time of baking, may be used.

Next, the coating liquid for forming a transparent conductive film containing the organic tin compound as the main component will be also explained below.

As the organic tin compound used in the present invention, the organic tin compounds, stated in the explanation of the coating liquid for forming a transparent conductive film containing the organic indium compound as the main component, can be used; and as the organic metal compound for a dopant improving the conductivity, it is preferable to use any one or more of the organic indium compounds, the organic antimony compounds and the organic phosphorous compounds.

As the organic indium compound, which is the organic metal compound for a dopant, the organic indium compound, stated in the previous explanation of the coating liquid for forming a transparent conductive film containing the organic indium compound as the main component, may be used.

The organic antimony compound for the organic metal compound for a dopant includes, for example, antimony (III) acetate [$Sb(CH_3COO)_3$], an antimony alkoxide such as antimony (III) ethoxide [$Sb(C_2H_5O)_3$] or antimony (III)-n-butoxide [$Sb(C_4H_9O)_3$], and the like, and basically organic antimony compounds capable of dissolving in a solvent and being decomposed into the oxide without generation of harmful gas such as chlorine gas or nitrogen oxide gas at the time of baking, may be used. Among these, the antimony (III)-n-butoxide is preferable because it is easily obtained at a relatively low price.

The organic phosphorous compound for the organic metal compound for a dopant includes, for example, triethyl phosphate [$PO(C_2H_5O)_3$], and the like, and basically organic phosphorous compounds capable of dissolving in a solvent and being decomposed into the oxide without generation of harmful gas such as chlorine gas or nitrogen oxide gas at the time of baking, may be used.

In addition, the coating liquid for forming a transparent conductive film containing the organic zinc compound as the main component will be explained below.

As the organic zinc compound used in the present invention, the organic zinc compound, stated in the explanation of the coating liquid for forming a transparent conductive film containing the organic indium compound as the main component, can be used; and as the organic metal compound for a dopant improving the conductivity, it is preferable to use any one or more of the organic aluminum compound, the organic indium compound and the organic gallium compound.

As the organic indium compound, which is the organic metal compound for a dopant, the organic indium compounds, stated in the previous explanation of the coating liquid for forming a transparent conductive film containing the organic indium compound as the main component, may be used.

The organic aluminum compound for the organic metal compound for a dopant includes an aluminum acetylacetone complex such as acetylacetone aluminum(aluminum-2,4-pentanedionate) [$Al(C_5H_7O_2)_3$], an aluminum alkoxide such as aluminum ethoxide [$Al(C_2H_5O)_3$], aluminum-n-butoxide [$Al(C_4H_9O)_3$], aluminum-tert-butoxide [$Al(C_4H_9O)_3$] or aluminum isopropoxide [$Al(C_3H_7O)_3$], and the like, and basically organic aluminum compounds capable of dissolving in a solvent and being decomposed into the oxide without generation of harmful gas such as chlorine gas or nitrogen oxide gas at the time of baking, may be used. Among these, the acetylacetone aluminum and the aluminum-n-butoxide are preferable because they are easily obtained at a relatively low price.

The organic gallium compound for the organic metal compound for a dopant includes a gallium acetylacetone complex such as acetylacetone gallium(gallium-2,4-pentanedionate) [$Ga(C_5H_7O_2)_3$], a gallium alkoxide such as gallium ethoxide [$Ga(C_2H_5O)_3$], and the like, and basically organic gallium compounds capable of dissolving in a solvent and being decomposed into the oxide without generation of harmful gas such as chlorine gas or nitrogen oxide gas at the time of baking, may be used.

Any one or more of the organic metal compounds of the organic indium compound, the organic tin compound and the organic zinc compound, or the organic metal compound and the organic metal compound for a dopant in the coating liquid for forming a transparent conductive film are the main compound starting materials for forming a transparent conductive film on a substrate. The total content thereof is within a range of preferably 1 to 30% by weight, more preferably 5 to 20% by weight.

When the total content is less than 1% by weight, only a thin transparent conductive film can be obtained, and therefore sufficient conductivity cannot be obtained. On the other hand, when it is more than 30% by weight, the organic metal compound in the coating liquid for forming a transparent conductive film may be too easily deposited, and therefore the stability of the coating liquid may be reduced, or the resulting transparent conductive film is so thick that cracks are generated, thus resulting in possibility of reduced conductivity.

When the organic metal compound for a dopant is mixed with the coating liquid for forming a transparent conductive film (when it is desired to obtain a high conductivity), the content ratio of the organic metal compound and the organic metal compound for a dopant is preferably from 99.9:0.1 to 66.7:33.3 in a molar ratio of the organic metal compound: organic metal compound for a dopant. For details, except for a case in which the organic zinc compound is used as the organic metal compound for a dopant in the coating liquid for forming a transparent conductive film containing the organic indium compound as the main component, the ratio is sufficiently from 99.9:0.1 to 87:13, in terms of a molar ratio of the organic metal compound:the organic metal compound for a dopant, preferably from 99:1 to 91:9.

When the organic zinc compound is used as the organic metal compound for a dopant in the coating liquid for forming a transparent conductive film containing the organic indium compound as the main component, the ratio is sufficiently from 95:5 to 66.7:33.3, in terms of a molar ratio of the organic metal compound:the organic metal compound for a dopant, preferably from 91:9 to 71:29.

Here, the molar ratio described above refers to a molar ratio of the metal component in the organic metal compound and the organic metal compound for a dopant. Accordingly, when two metal elements are contained in one molecule of the organic metal compound for a dopant, for example, the result of conversion is that the number of moles of the metal element to one mole of the organic metal compound for a dopant is two.

The transparent conductive film may not necessarily require a high conductivity, depending on the device to which the transparent conductive film is applied and, on the contrary, high resistance value may be required. In such a case, in order to obtain a transparent conductive film having a high resistance, the organic metal compound for a dopant is not intentionally mixed with the coating liquid for forming a transparent conductive film, and such a coating liquid can be used.

When the amount of the organic metal compound for a dopant is outside the molar ratio range described above, and is either too large or too small, the carrier density of the transparent conductive may be decreased, thus resulting in rapid worsening of the conductivity of the transparent conductive film. When the amount of the organic metal compound for a dopant is more than the molar ratio range described, the continuation of crystal growth of the conductive oxide microparticles becomes difficult, and undesirably the conductivity may be reduced.

In addition, a binder may be added to the coating liquid for forming a transparent conductive film, if necessary. When the binder is added, the wettability to the substrate is improved, and at the same time, the viscosity of the coating liquid can be controlled. As the binder, materials which performs combustion or heat decomposition at the time of baking are preferable, and useful materials thereof includes cellulose derivatives, acrylic resins, and the like.

The cellulose derivative used as the binder includes methyl cellulose, ethyl cellulose, hydroxymethyl cellulose, hydroxyethyl cellulose, hydroxypropyl cellulose, hydroxyethyl methyl cellulose, hydroxypropyl methyl cellulose, ethyl hydroxyethyl cellulose, carboxymethyl cellulose, carboxyethyl cellulose, carboxyethyl methyl cellulose, nitrocellulose, and the like. Among these, the hydroxypropyl cellulose (hereinafter may be sometimes referred to as "HPC") is preferable.

When HPC described above is used, sufficient wettability can be obtained by using only a content of 5% by weight or less and, at the same time, the viscosity can be widely controlled. As HPC has a combustion starting temperature of about 300° C., if the baking is performed at 300° C. or higher, preferably 350° C. or higher, HPC is combusted. The particle growth of the produced conductive particles, therefore, is not inhibited, and a transparent conductive film having a high conductivity can be produced. When the content of HPC is more than 5% by weight, HPC exhibits in the form of a gel and easily remains in the coating liquid, which leads to formation of a very porous transparent conductive film having a remarkably reduced transparency or conductivity.

Here, if ethyl cellulose is used instead of HPC as the cellulose derivative, for example, the viscosity of the coating liquid can be set at a value lower than that of a coating liquid using HPC, but if such a coating liquid is used in a method in which a high-viscous coating liquid is preferably used such as a screen printing method, pattern printability is reduced a little.

Now, nitrocellulose has excellent heat decomposition property, but harmful nitrogen oxides gas is generated at the time of baking, and thus a baking furnace may be deteriorated or an exhaust gas treatment may become problematic. As described above, it is necessary to appropriately select the cellulose derivative to be used, according to the situation.

As the acrylic resin, one capable of combustion at a relatively low temperature is preferable.

As a solvent used for the coating liquid for forming a transparent conductive film, it is preferable to use an alkyl phenol and/or an alkenyl phenol and a dibasic acid ester; an alkyl phenol and/or an alkenyl phenol and benzyl acetate; or a mixed solution thereof, which are capable of dissolving the acetylacetone complex such as acetylacetone indium, acetylacetone zinc or acetylacetone vanadium in a high concentration. The alkyl phenol and the alkenyl phenol includes cresols, xylenol, ethyl phenol, p-tert-butyl phenol, octyl phenol, nonyl phenol, cashew nut liquid [3-pentadecadecyl phenol] and the like, and as the dibasic acid ester (for example, a dibasic acid dimethyl, a dibasic acid diethyl, and the like), a succinate ester, a glutarate ester, an adipate ester, a malonate ester, a phthalate ester, and the like are used.

Furthermore, as a solvent which is mixed with the coating liquid for forming a transparent conductive film, in order to lower the viscosity of the coating liquid or improve the coating property, any solvent compatible with the solution in which the organic indium compound, the organic metal compound for a dopant, and the cellulose derivative and/or the acrylic resin are dissolved, may be used. Examples thereof may be include, but not limited to, water, alcohol solvents such as methanol (MA), ethanol (EA), 1-propanol (NPA), isopropanol (IPA), butanol, pentanol, benzyl alcohol, and diacetone alcohol (DAA); ketone solvents such as acetone, methyl ethyl ketone (MEK), methyl propyl ketone, methyl isobutyl ketone (MIBK), cyclohexanone and isophorone; ester solvents such as ethyl acetate, butyl acetate, isobutyl acetate, amyl formate, isoamyl acetate, butyl propionate, isopropyl butyrate, ethyl butyrate, butyl butyrate, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, methyl 3-oxypropionate, ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methyl propionate, ethyl 2-oxy-2-methyl propionate, methyl 2-methoxy-2-methyl propionate, ethyl 2-ethoxy-2-methyl propionate, methyl pyruvate, ethyl pyruvate, propyl pyruvate, methyl acetoacetate, ethyl acetoacetate, methyl 2-oxobutanoate, and ethyl 2-oxobutanoate; glycol derivatives such as ethylene glycol monomethyl ether (MCS), ethylene glycol monoethyl ether (ECS), ethylene glycol isopropyl ether (IPC), ethylene glycol monobutyl ether (BCS), ethylene glycol monoethyl ether acetate, ethylene glycol monobutyl ether acetate, propylene glycol methyl ether (PGM), propylene glycol ethyl ether (PE), propylene glycol methyl ether acetate (PGM-AC), propylene glycol ethyl ether acetate (PE-AC), diethylene glycol monomethyl ether, diethylene glycol monoethyl ether, diethylene glycol monobutyl ether, diethylene glycol monomethyl ether acetate, diethylene glycol monoethyl ether acetate, diethylene glycol monobutyl ether acetate, diethylene glycol dimethyl ether, diethylene glycol diethyl ether, diethylene glycol dibutyl ether, dipropylene glycol monomethyl ether, dipropylene glycol monoethyl ether, and dipropylene glycol monobutyl ether; benzene derivatives such as toluene, xylene, mesitylene and dodecyl benzene; formamide (FA), N-methylformamide, dimethyl formamide (DMF), dimethyl acetoamide, dimethyl sufoxide (DMSO), N-methyl-2-pyrrolidone (NMP), γ-butyrolactone, ethylene glycol, diethylene glycol, propylene glycol, dipropylene glycol, 1,3-butylene glycol, pentamethylene glycol, 1,3-octylene glycol, tetrahydrofuran (THF), chloroform, mineral spirits, terpineol, and some mixed liquids thereof.

In view of the stability and the film-forming property of the coating liquid, it is preferable to use methyl ethyl ketone (MEK), cyclohexanone, propylene glycol monomethyl ether (PGM), N-methyl-2-pyrrolidone (NMP) or γ-butyrolactone, as the solvent.

The coating liquid for forming a transparent conductive film used in the present invention is produced by heat-dissolving a mixture of any one or more of the organic metal compounds of the organic indium compound, the organic tin compound and the organic zinc compound; and, if necessary, any one or more of the organic metal compounds for a dopant; and, if necessary the binder.

The heat-dissolution is generally performed by stirring the mixture at a heating temperature of 60 to 200° C. for 0.5 to 12 hours. When the heating temperature is lower than 60° C., the mixture can insufficiently dissolved, and, for example, in a case of the coating liquid for forming a transparent conductive film containing the organic indium compound as the main component, deposition and separation of the metal compound such as acetylacetone indium occurs, thus resulting in decrease of the stability of the coating liquid. On the other hand, when it is higher than 200° C., evaporation of the solvent becomes marked, and thus the composition of the coating liquid is undesirably changed.

The viscosity of the coating liquid for forming a transparent conductive film can be controlled by controlling the molecular weight or the content of the binder, or the kind of the solvent. The coating liquid, therefore, can respond to various coating methods such as the ink jet printing method, the screen printing method, the gravure printing method; the offset printing method, the flexo printing method, the dispenser printing method, the slit coating method, the die coating method, the doctor blade coating method, the wire bar coating method, the spin coating method and the spray coating method by controlling the viscosity of the liquid to an appropriate viscosity for each of the coating methods.

A high-viscous (about 5000 to 50000 mPa·s) coating liquid can be produced by addition of a high molecular weight binder in an amount of 5% by weight or less, preferably 2 to 4% by weight, whereas a low-viscous (about 5 to 500 mPa·s) coating liquid can be produced by addition of a low molecular weight binder in an amount of 5% by weight or less, preferably 0.1 to 2% by weight, and dilution with a low viscous solvent for dilution. A medium-viscous (about 500 to 5000 mPa·s) coating liquid can be produced by mixing a high-viscous coating liquid with a low-viscous coating liquid.

[Method for Producing Transparent Conductive Film]

The method for producing the transparent conductive film of the present invention will be explained in detail.

The transparent conductive film of the invention is formed via a coating step in which the heat-resistant substrate is coated with the coating liquid for forming a transparent conductive film to form a coating film; a drying step in which the coating film is dried to form a dried coating film; and a baking step in which the dried coating film is baked to form an inorganic film.

(a) Coating Step

The heat-resistant substrate is coated with the coating liquid for forming a transparent conductive film in various coating methods such as an ink jet printing method, a screen printing method, a gravure printing method, an offset printing method, a flexo printing method, a dispenser printing method, a slit coating method, a die coating method, a doctor blade coating method, a wire bar coating method, a spin coating method, and a spray coating method.

As the heat-resistant substrate, inorganic substrates such as soda-lime glass, non-alkali glass and quartz glass; and resin substrates (heat-resistant plastic films) such as polyimide (PI) can be used.

(b) Drying Step

In this drying step, the substrate coated with the coating liquid for forming a transparent conductive film is usually maintained at 80 to 180° C. for 1 to 30 minutes, preferably 2 to 10 minutes, in the air, whereby the coating film is dried to produce a dried coating film. The drying conditions (drying temperature and drying time) may be appropriately selected depending on the kind of the heat-resistant substrate used, the coating film thickness of the coating liquid for forming a transparent conductive film, and the like. In view of the productivity, however, it is desirable to reduce the drying time to a necessary and minimum time during which the quality of the resulting dried coating film is not deteriorated.

This dried coating film is one formed by volatilizing and removing the organic solvent described above from the coating liquid for forming a transparent conductive film, and is composed of the organic system components such as any one or more of the organic metal compounds of the organic indium compound, the organic tin compound and the organic zinc compound, (the organic metal compound for a dopant), the binder, and the like.

(c) Baking Step

In the baking step, the dried coating film, obtained in the drying step described above, is subjected to a heat treatment (baking), whereby the organic system components (such as any one or more of the organic metal compounds of the organic indium compound, the organic tin compound and the organic zinc compound, the organic metal compound containing the organic metal compound for a dopant, the binder, and the like, in the dried coating film are heat-decomposed or combusted (oxidized) to thereby form an inorganic film (a transparent conductive film of a conductive oxide microparticle layer that is densely filled with conductive oxide microparticles) made up of an inorganic component (a conductive oxide containing the metal oxide as the main component). That is, when the heating temperature becomes higher in the course of temperature elevation of the baking step, any one or more of the organic metal compounds of the organic indium compound, the organic tin compound and the organic zinc compound, (including the organic metal compound containing the organic metal compound for a dopant) in the dried coating film are gradually heat-decomposed or combusted (oxidized), and the conductive oxide is transformed into an amorphous state (here, the state refers to a ultrafine particle state such as a crystallite size, obtained by an X-ray diffraction, of less than 3 nm; in other words, mineralization occurs. After that, when the heating temperature is further elevated and is over the range of, usually, 300 to 330° C., or the temperature is kept at the range of 300 to 330° C. for a long period of time, the conductive oxide is crystallized, then the crystals are grown, and finally the conductive oxide microparticles, which are the component for forming the transparent conductive film, are formed.

The temperature of 300 to 330° C., as described above, shows a temperature range in which the mineralization or the crystallization can easily occur in general. For example, if the heating is continued for a long period of time, even if the temperature is about 270° C., the mineralization or the crystallization of the conductive oxide may occur. The baking temperature of the baking step in the invention, accordingly, is not limited to a temperature of 300° C. or higher.

On the other hand, similarly, the binder is also gradually heat-decomposed or combusted (oxidized) in the course of temperature elevation in the baking step, but it is mainly transformed into carbon dioxide ($CO_2$), and disappears from the film by volatilization into the atmosphere (for example, in a case of HPC, almost all of HPC disappears at about 300 to 350° C., although depending on the kind of the binder), and finally the binder hardly remains in the transparent conductive film. It can be considered that as a large amount of the binder remains until an initial stage of the baking step (a certain stage in the course of temperature elevation, for example, a stage at which the temperature reaches 300° C. from room temperature by heating), the binder is uniformly interposed between the amorphous conductive oxide particles to inhibit the crystallization, but the binder component gradually disappears as the baking proceeds, which leads to crystallization of the conductive oxide.

The baking step will be explained in more detail below.

In the baking step of the dried coating film, first, an oxygen-containing atmosphere having a low dewpoint, i.e., a low water vapor content (for reference, a relationship between a saturated water vapor content (% by volume) and a dewpoint (° C.) in the air is shown in FIG. 1) is applied to the atmosphere in the course of temperature elevation, whereby the crystallization of the conductive oxide, and the crystal growth thereof, which occur in the initial stage of the baking step as described above, are inhibited, and thus the film structure of the invention of the conductive oxide microparticle layer that is densely filled with conductive oxide microparticles can be obtained. Although it is not necessarily clear about a mechanism how the conductive oxide microparticles are densified, for example, the following mechanism can be considered.

That is, at least until the time at which the crystallization of the conductive oxide, generated in the course of temperature elevation in the baking step, starts (an initial stage of the baking step; usually at about 300 to 330° C. in the present invention), a film structure in which the binder is uniformly interposed between the amorphous conductive oxide particles is maintained, and the film structure is soft due to the action of the binder, which is the organic substance, which enables the shrinkage (densification) of the film in a vertical direction to the substrate. It can be supposed that, as a result, when the baking is performed by heating under an air atmosphere having a low dewpoint, the crystallization of the conductive oxide can be inhibited until a borderline heating temperature at which the binder disappears (until about 300 to 350° C.), and the shrinkable film structure can be obtained, which leads to the densification of the film.

Although it is not clear why the crystallization of the conductive oxide particles and the crystal growth thereof can be inhibited under the air atmosphere having a low dewpoint, i.e., a low water vapor content, it can be considered that, for example, the water vapor in the air atmosphere (1) has an activity for promoting the heat decomposition or combustion (oxidization) of the binder component interposed between the conductive oxide particles; or (2) has an activity for promoting the crystallization of the conductive oxide particles themselves and the crystal growth thereof, and the like.

Specifically, first, the temperature is elevated to a temperature or higher at which the conductive oxide is crystallized (usually from 300 to 330° C. or higher), while an oxygen-containing atmosphere gas having a dewpoint of −10° C. or lower is supplied thereto, whereby the densification of the film is attempted. After the film densification, the baking can be continued while an oxygen-containing atmosphere gas having a dewpoint of 0° C. or higher is supplied, if necessary, thus resulting in promotion of the crystal growth of the conductive oxide microparticles. Further, after the densification of the film (baking in the oxygen-containing atmosphere gas having a dewpoint of −10° C. or lower) is performed, or after the promotion of the crystal growth (baking in the oxygen-containing atmosphere gas having a dewpoint of 0° C. or higher) subsequent to the densification, it is preferable to perform baking while a neutral atmosphere gas or a reducing atmosphere gas is supplied.

The oxygen-containing atmosphere gas includes air or a mixed gas of oxygen and neutral or inert gas (such as nitrogen, argon, and the like), and air is preferable because it can be easily obtained at a low price.

The dewpoint of the oxygen-containing atmosphere gas having a dewpoint of −10° C. or lower is preferably −15° C. or lower, more preferably −20° C. or lower, further more preferably −30° C. or lower, most preferably −40° C. or lower.

When the dewpoint is higher than −10° C. in the baking in which the temperature is elevated to a temperature or higher at which the conductive oxide is crystallized under the oxygen-containing atmosphere having a dewpoint of −10° C. or lower (usually from 300 to 330° C. or higher in the present invention), in the course of the formation of the conductive oxide microparticle layer made up of the conductive oxide microparticles, water vapor promotes the crystallization of the conductive oxide, and the crystal growth thereof at an initial stage of the baking in which a large amount of the binder still remains, and thus the film structure in which the binder is uniformly interposed between the amorphous conductive oxide particles and which is capable of shrinking in a vertical direction of the film, is broken, and the conductive oxide microparticles adhere to each other and do not become movable. As a result, undesirably, the densification of the film is inhibited, and the conductivity and the film strength of the transparent conductive film are reduced.

Further, in order to promote the crystallization, the dewpoint in the baking in the oxygen-containing atmosphere gas having a dewpoint of 0° C. or higher, which is performed after the film densification if necessary, is preferably 10° C. or higher, more preferably 20° C. or higher. When the dewpoint is 0° C. or higher, the water vapor promotes the crystal growth of the conductive oxide microparticles in the dense film, and thus both the densification of the film and the crystal growth can be attained, and the conductivity and the film strength of the transparent conductive film can be increased.

In the baking in which the temperature is elevated to a temperature or higher at which the conductive oxide is crystallized (usually 300 to 330° C. or higher in the present invention) under the oxygen-containing atmosphere having a dewpoint of −10° C. or lower, the baking is performed at a baking temperature (peak temperature), which is obtained by the temperature elevation, of 300° C. or higher, more preferably 350° C. or higher, further more preferably 400° C. or more, for 5 to 120 minutes, more preferably from 15 to 60 minutes.

When the baking temperature is lower than 300° C., particularly lower than 270° C., the heat decomposition or the combustion of the organic components (the organic components contained in the organic indium compound, the organic metal compound for a dopant, and the binder, and the like), which are usually contained in the dried coating film, becomes easily insufficient, and these organic components remain in the transparent conductive film. As a result, the conductive oxide is not crystallized and the densification of the film is insufficient, and thus the transparency or the conductivity of the film may be sometimes reduced. The baking temperature described above, therefore, is not so preferable. However, when the baking time is extended to, for example, about 60 minutes, or when the film thickness of the final transparent conductive film is thin because of being about 130 nm or less, the heat decomposition or the combustion of the organic components can proceed at even a baking temperature of, for example, about 270° C., and the transparency or the conductivity of the film may not be reduced. Accordingly, the baking temperature is generally preferably 300° C. or higher, but the baking temperature of about 270° C. is also applicable, depending on the conditions (a film thickness, baking time, and the like) in each step.

The upper limit of the baking temperature is not particularly limited, but it depends on the kind of the baking apparatus used in the baking step or the heat-resistance of the heat-resistant substrate. As a soda-lime glass substrate, which is inexpensive and is most generally used, has a strain point of about 510° C., it is preferable to perform the baking at a temperature lower than that temperature. If the soda-lime glass substrate is baked on a heat-resistant substrate having a higher heat resistance, the strain of the substrate can be made relatively small, and therefore the baking can be performed at about 600° C. When a glass substrate having a higher heat resistance, such as a quartz glass substrate, a non-alkali glass substrate or a glass substrate having a high strain point, is used, a higher baking temperature can be applicable.

When a polyimide (PI) film, which is a heat-resistant plastic, is used as the heat-resistant substrate, the baking can be performed at up to about 400° C., depending on the kind of the polyimide, though.

The baking apparatus used in the baking step includes, but not limited to, a hot plate, a circulation hot air baking oven, an infrared heating apparatus, and the like. In order to carry out the present invention, however, it is necessary to use the oxygen-containing atmosphere having a dewpoint of −10° C. or lower, and therefore, the baking apparatus described above is required to be able to control the baking atmosphere.

The rate of temperature elevation until a temperature at which the conductive oxide is crystallized in the course of temperature elevation in the baking step, is not particularly limited, and it is within the range of 5 to 40° C./minute, more generally 10 to 30° C./minute. When the rate of temperature elevation is lower than 5° C./minute, it takes time too much for temperature elevation, thus resulting in low efficiency, whereas when a rate of temperature elevation of higher than 40° C./minute is realized in the baking apparatus described above, a volume of a heater becomes impractically too large.

The baking conditions in the baking under the oxygen-containing atmosphere having a dewpoint of 0° C. or higher are the same as the usual baking conditions in the baking in which the temperature is elevated to a temperature or higher at which the conductive oxide is crystallized (usually 300 to 330° C. or higher) under the oxygen-containing atmosphere having a dewpoint of −10° C. or lower, and the baking is performed at a temperature of 300° C. or higher, more preferably 350° C. or higher, further more preferably 400° C. or higher, for 5 to 120 minutes, more preferably from 15 to 60 minutes.

When the baking temperature is lower than 300° C., particularly lower than 270° C., as described above, usually the effect for promoting the crystallization of the conductive oxide microparticles becomes easily insufficient, and it is hard to expect remarkable improvement of the conductivity and the film strength. Such a baking temperature, therefore, is not preferable.

When the baking is performed under a neutral atmosphere or a reducing atmosphere subsequent to the baking under the oxygen-containing atmosphere, preferably, oxygen vacancies are formed in the conductive oxide microparticles to increase a carrier concentration, thus resulting in improvement of the conductivity of the transparent conductive film.

In the baking under the neutral atmosphere or the reducing atmosphere, the constituent elements (indium, oxygen, and the like) of the conductive oxide microparticles are easily diffused due to oxygen vacancies formed in the film, and therefore this baking has an effect for promoting the crystal growth of the conductive oxide microparticles stronger than that of the baking in the oxygen-containing atmosphere gas having a dewpoint 0° C. or higher. Thus, this baking is preferable from the viewpoint of not only the improvement of the conductivity of the transparent conductive film, but also the effectiveness for the stabilization (inhibition of change with time) of the conductivity.

The neutral atmosphere is made up of any one or more of nitrogen gas and inert gases (argon, helium, and the like); and the reducing atmosphere includes hydrogen gas, an atmosphere in which any one or more of hydrogen or organic solvent vapor (organic gas such as methanol) is contained in the neutral atmosphere described above, and the like. However, any atmosphere may be used so long as oxygen atoms are removed from the densely packed conductive oxide microparticles to form oxygen vacancies, thus resulting in the improvement of the conductive carrier concentration in the atmosphere, and the neutral or reducing atmosphere is not limited to those described above. However, a too strongly reducing atmosphere is not preferable, because the indium oxide may sometimes be reduced into metal indium.

When the baking temperature is from about 250 to 450° C., even if a mixed gas of 1 to 2% hydrogen-99 to 98% nitrogen leaks into the air, there is not possibility of explosion, and the indium oxide is hardly reduced into the metal indium, and therefore such an atmosphere and a baking temperature are preferable.

The baking conditions in the baking under neutral atmosphere or the reducing atmosphere is that the baking is performed at a baking temperature of 250° C. or higher, more preferably 350° C. or higher, for 5 to 120 minutes, more preferably 15 to 60 minutes. The baking temperature is desirably 350° C. or higher, more preferably 450° C. or higher from the viewpoint to further promotion of the crystal growth of the conductive oxide microparticles.

The baking temperature of lower than 250° C. is not preferable, because the oxygen vacancies are not sufficiently formed in the conductive oxide microparticles, and therefore it cannot be expected to improvement of the conductivity of the transparent conductive film due to the increased carrier concentration.

The upper limit of the baking temperature is not particularly limited, but with respect to the point in which it depends on the kind of the baking apparatus used in the baking step or the heat-resistance of the heat-resistant substrate, the same as in the baking under the oxygen-containing atmosphere holds true for this case.

Further, in the baking under the reducing atmosphere, if the baking temperature is too high, the conductive oxide forming the transparent conductive film may sometimes be excessively reduced, and thus this baking should be performed carefully. For example, when a strongly reducing atmosphere such as hydrogen gas is used at a baking temperature of higher than 600° C., the metal oxide, which is the conductive oxide, may be reduced into a metal element in a short time (for example, the indium oxide may be reduced into metal indium), and therefore it is required to select an adequate reducing atmosphere and to set a reducing time.

The baking under the oxygen-containing atmosphere having a dewpoint of −10° C. or lower, in which the temperature is elevated to a temperature or higher at which the conductive oxide is crystallized, the baking under the oxygen-containing atmosphere having a dewpoint of 0° C. or higher, and the baking under the neutral atmosphere or the reducing atmosphere can be performed in series. That is, when the heat-resistant substrate on which the dried coating film is formed, is baked, for example, the temperature of the substrate is elevated to a baking temperature of 300° C. or higher, and then, while the temperature is kept at that temperature, only the oxygen-containing atmosphere having a dewpoint of −10° C. or lower to is change to the oxygen-containing atmosphere having a dewpoint of 0° C. or higher, or to the neutral atmosphere or the reducing atmosphere.

As described above, the baking under the neutral atmosphere or the reducing atmosphere has, in addition to the action for increasing the carrier concentration due to the formation of the oxygen vacancies in the conductive oxide, as described above, an action for promoting the crystal growth by making the elements forming the transparent conductive film more easily movable due to the presence of the oxygen vacancies, and therefore the baking contribute to the further improvement of the strength of the transparent conductive film and the conductivity.

Next, devices utilizing the transparent conductive film or the transparent conductive substrate of the present invention will be explained. Such a device includes, as described above, light emitting devices such as an LED element, an electroluminescent lamp (electroluminescent element) and a field emission lamp; electric power-generating devices such as a solar cell; display devices such as a liquid crystal display (liquid crystal element), an electroluminescent display (electroluminescent element), a plasma display and an electronic paper element; input devices such as a touch panel, and the like. The transparent conductive film and the transparent conductive substrate of the present invention are suitably used as a transparent electrode for these devices. Some devices will be explained below.

Here, the electroluminescent element as the light emitting device include an organic EL element using an organic luminescent material, and an inorganic EL element using an inorganic luminescent material, and the organic EL element has recently shot into the limelight.

The organic EL element is a self-luminous element, unlike the liquid crystal display element, and it is expected to be a display device such as a display, because it can provide a high brightness with a low-power operation. The EL element include a low molecular weight type and a high molecular weight type, for example, the high molecular type has a structure in which a positive hole injection layer (a hole injection layer) made up of a conductive polymer such as a polythiophene derivative, an organic luminous layer (a luminous layer of polymer formed by wet-coating), a cathode electrode layer [luminous a metal layer of magnesium (Mg), calcium (Ca) or aluminum (Al), which has a good injection property of electrons into the luminous layer and a low work function], and a gas barrier coating layer (or sealing treatment with a metal or glass) are sequentially formed on the transparent conductive film, which is an anode electrode. The gas barrier coating layer is necessary for preventing the deterioration of the organic EL element, and oxygen barrier and water vapor barrier are required. With respect to the water vapor, for example, a very high barrier performance such as a water vapor permeability of about $10^{-5}$ g/m$_2$/day is required, and the inside of the organic EL element (device) has a structure in which it is completely sealed from the outside.

The solar cell, which is the electric power-generating device, is an electric generating element capable of converting sunlight into electric energy, and includes a silicon solar cell (a thin film type, a microcrystal type, and a crystal type) a CIS solar cell (a copper-indium-selenium thin film), a CIGS solar cell (a copper-indium-gallium-selenium thin film), a dye-sensitized solar cell, and the like. The silicon solar cell is, for example, one in which a transparent electrode, a semiconductor electric-power generating layer (silicon) and a metal electrode are sequentially formed on a transparent substrate.

The liquid crystal element, which is the display device, is a non-luminous type electronic display element which is widely used for displays in cell phones, PDAs (personal digital assistants), and PCs (personal computers). There are simple matrix displays (passive matrix displays) and active matrix displays. The active matrix display is superior in an image quality or response speed. The basic structure thereof is a structure in which liquid crystal is sandwiched with the transparent electrodes (the transparent conductive film of the invention is used), and the display is performed by orienting the liquid crystal molecules with a power operation. Practically, the element is further laminated with a color filter, a retardation film, and a polarizing film, in addition to the transparent electrode.

The different type of the liquid crystal element includes a polymer dispersion liquid crystal element (hereinafter referred to as "PDLC element") and a polymer network liquid crystal element (hereinafter referred to as "PNLC element"), which are used for an optical shutter in a window. Both of the basic structures are, as described above ones in which the liquid crystal layer is sandwiched with electrode (at least one of them is a transparent electrode and the transparent conductive film of the invention is used as the electrode), and a transparent/non-transparent alteration of the exterior appearance of the liquid crystal layer is performed by orienting the liquid crystal molecules with a power operation. Unlike the liquid crystal display element described above, practically, this element is not necessary to use a retardation film and a polarizing film, and therefore it has a characteristic of a simple element structure.

Now, the PDLC element has a structure in which microcapsulated liquid crystals are dispersed in a polymer resin matrix, whereas the PNLC element has a structure in which liquid crystals are filled in meshes of a resin mesh network. In general, the PDLC element has a high resin content in the liquid crystal layer, and therefore an AC driving voltage of several tens of volts or higher (for example, about 80 V) is necessary, whereas the PNLC element capable of decreasing the resin content in the liquid crystal layer can drive at an AC voltage of several to about 15 V. In order to ensure the display stability of the liquid crystal element, it is necessary to prevent the contamination of water vapor into the liquid crystal, and therefore, it is required to have, for example, a water vapor permeability of 0.01 g/m$^2$/day or lower, and the inside of the liquid crystal element (device) has a structure in which it is completely sealed from the outside.

The electronic paper element, which is the display device, is a non-luminous type electronic display element which itself does not emit. It has a memory effect in which the display remains as it is even after it is turned off, and it is expected to be a character display. As the display type, an electrophoretic display in which colored particles are moved in liquid between the electrodes by an electrophoretic method; a twist-ball display in which coloring is performed by spinning dichlomatic particles on an electric field; a liquid crystal display in which display is performed by sandwiching, for example, cholesteric liquid crystals with transparent electrodes; a powder display in which display is performed by moving colored particles (a toner) or an electronic liquid powder (Quick Response Liquid Powder) in the air; an electrochromic display in which color development is performed based on an electrochemical oxidation-reduction reaction; an electrodeposition display in which display is performed by change of color caused by depositing and dissolving a metal by an electrochemical oxidation-reduction, and the like, have been developed. These displays all have a structure in which the display layer is sandwiched with the transparent conductive film (transparent electrode) and the counter electrode.

In the electronic paper elements of the various displays, in order to ensure the display stability, it is necessary to prevent the contamination of water vapor into the display layer. The water vapor permeability, for example, should be from 0.01 to 0.1 $g/m_2/day$, depending on the kind of the display, and the inside of the electronic paper element (device) has a structure in which it is completely sealed from the outside.

The touch panel is an element for inputting a position, and includes a resistive type, a capacitive type, and the like.

For example, the resistive-type touch panel has a structure in which two transparent conductive substrates, which are resistant films for detecting coordinates, are laminated with each other through a dot transparent spacer. The transparent conductive substrate is required to have durability of finger operation, and the transparent conductive film is required to have flexibility in order not to generate cracks. With respect to the capacitive-type touch panel, it is required to further improve the conductivity of the transparent conductive film due to increased resolution.

For all of the light emitting devices, the electric power-generating device, the display device and the input device described above, it is required to improve the device property. When the transparent conductive film and the transparent conductive substrate of the present invention, is employed as the transparent electrodes in those devices, the basic properties of the devices can be further improved, and therefore the present invention can make great contributions to, for example, energy saving or miniaturization of the devices, and the like.

The present invention will be explained in detail by means of Examples below, but the invention is not limited to Examples.

Example 1

Production of Solution, Liquid A

Acetylacetone indium (a full name: tris (acetylacetonato) indium) [$In(C_5H_7O_2)_3$] (molecular weight=412.15) 40 g, p-tert-butyl phenol 42 g, a dibasic acid ester (manufactured by DuPont Japan Limited) 14 g, and hydroxypropyl cellulose (HPC) 4 g were mixed, and the mixture was heated to 130° C., which was stirred for 90 minutes to dissolve it. Next, the obtained solution 25 g, cyclohexanone 25 g, propylene glycol monomethyl ether (PGM) 10 g, and methyl ethyl ketone (MEK) 40 g were mixed and thoroughly stirred until the mixture was uniform, whereby a solution (liquid A) containing the acetylacetone indium and the hydroxypropyl cellulose was produced.

Production of Solution, Liquid B

Acetylacetone tin (a full name: di-n-butyl bis(2,4-pentanedionate)tin [$Sn(C_4H_9)_2(C_5H_7O_2)_2$] (a molecular weight=431.14) 40 g, p-tert-butyl phenol 42 g, a dibasic acid ester (manufactured by DuPont Japan Limited) 14 g, and hydroxypropyl cellulose (HPC) 4 g were mixed, and the mixture was heated to 130° C., which was stirred for 90 minutes to dissolve it. The obtained solution 25 g, cyclohexanone 25 g, propylene glycol monomethyl ether (PGM) 10 g and methyl ethyl ketone (MEK) 40 g were mixed, and the mixture was thoroughly stirred until the mixture was uniform, whereby a solution (liquid B) containing the acetylacetone tin and the hydroxypropyl cellulose was produced.

Production of Coating Liquid

Produced Liquid A 9.6 g and liquid B 0.4 g were thoroughly stirred until the mixture was uniform, whereby a coating liquid for forming a transparent conductive film containing the acetylacetone indium and the acetylacetone tin in a total content of 10% by weight, and the hydroxypropyl cellulose in a content of 1% by weight was produced.

Production of Transparent Conductive Film

A whole surface of a soda-lime glass substrate (10 cm×10 cm×3 mm (thickness); a haze value=0.26%, a visible-light transmittance=91.1%) having a temperature of 25° C. was spin-coated (250 rpm×60 seconds) with the resulting coating liquid for forming a transparent conductive film, and after that it was dried at 180° C. for 20 minutes using a hot air drier. Further, the temperature was elevated to 500° C. for 50 minutes (a rate of temperature elevation: 10° C./minute) using a hot plate under an air atmosphere having a dewpoint of −30° C. (one liter/minute supply), baking was performed at 500° C. for 15 minutes, only the atmosphere was changed into an atmosphere of 2% hydrogen-98% nitrogen (one liter/minute supply), and the baking was continued at 500° C. for further 15 minutes, whereby a transparent conductive film of Example 1 containing indium oxide ($In_2O_3$) as the main component and containing tin oxide ($SnO_2$) for a dopant was produced.

Next, various properties of the surface resistivity, the haze value, the visible-light transmittance, the film thickness, the crystallite size, and pencil hardness of the transparent conductive film were measured, and the results are shown in Table 1.

Figure 2:
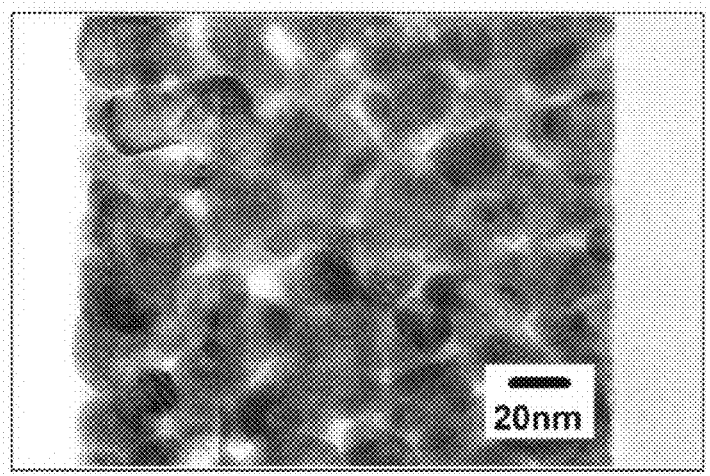
FIG. 2 is a transmission electron micrograph (TEM image) of a cross-section of a transparent conductive film of Example 1.
Figure 3:
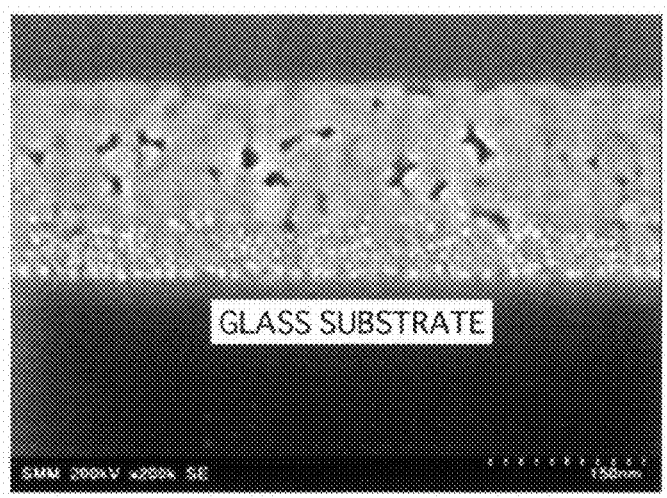
FIG. 3 is a scanning electron micrograph (SEM image) of a cross-section of a transparent conductive film of Example 1.

Further, a transmission electron micrograph (a TEM image) and a scanning electron micrograph (a SEM image), obtained by observing the cross-section of the transparent conductive film of Example 1 with a transmission electron microscope, are respectively shown in FIG. 2 and FIG. 3. A conductive oxide microparticle layer that was densely filled with conductive oxide microparticles was observed.

The surface resistivity of the transparent conductive film was measured by using a surface resistance meter Loresta AP (MCP-T400) manufactured by Mitsubishi Chemical Corporation.

The haze value and the visible-light transmittance were measured by using a haze meter (ND H 5000) manufactured by Nippon Denshoku Industries Co., Ltd. in accordance with JIS K 7136 (the haze value) and JIS K 7361-1(the transmittance), respectively.

The film thickness was measured by using a stylus-based surface profiler (Alpha-Step IQ) manufactured by KLA-Tencor Corporation.

With respect to the crystallite size, an X-ray diffraction was measured, and the crystallite size was obtained from the (222) peak of the indium oxide ($In_2O_3$) in accordance with a Scherrer method.

The pencil hardness was measured in accordance with JIS K 5400.

The visible-light transmittance and the haze value are the values of only the transparent conductive film, and they were obtained from the following formula 1 and the formula 2, respectively.

Transmittance of Transparent Conductive Film (%)=(a transmittance obtained by measuring each substrate on which the transparent conductive film was formed)/(a transmittance of the substrate)× 100   [formula 1]

Haze Value of Transparent Conductive Film (%)=(a haze value obtained by measuring each substrate on which the transparent conductive film was formed)−(a haze value of the substrate)   [formula 2]

Example 2

The same procedure of Example 1 was repeated except that, in the baking using the hot plate in Example 1, the temperature was elevated to 350° C. for 35 minutes (a rate of temperature elevation: 10° C./minute) under an air atmosphere having a dewpoint of −30° C. (one liter/minute supply), the baking was performed at 350° C. for 15 minutes, only the atmosphere was changed to an atmosphere of 2% hydrogen-98% nitrogen (one liter/minute supply), and the baking was continued at 350° C. for further 15 minutes, whereby a transparent conductive film of Example 2 containing indium oxide ($In_2O_3$) as the main component and tin oxide ($SnO_2$) for a dopant was produced.

The various properties of the transparent conductive film produced were measure in the same manner as in Example 1. The results are shown in Table 1.

Figure 4:
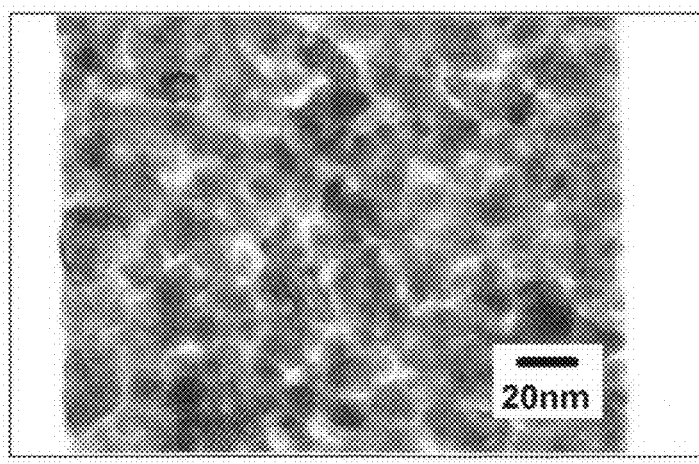
FIG. 4 is a transmission electron micrograph (TEM image) of a cross-section of a transparent conductive film of Example 2.
Figure 5:
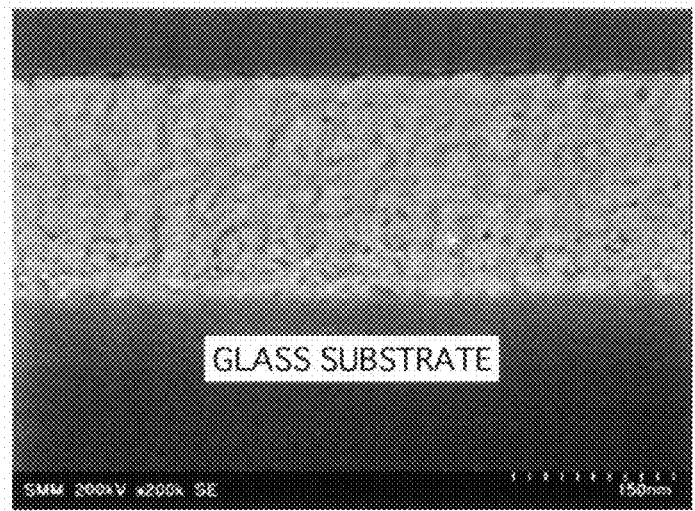
FIG. 5 is a scanning electron micrograph (SEM image) of a cross-section of a transparent conductive film of Example 2.

Further a transmission electron micrograph (a TEM image) and a scanning electron micrograph (a SEM image), obtained by observing the cross-section of the transparent conductive film of Example 2 with a transmission electron microscope, are respectively shown in FIG. 4 and FIG. 5. A conductive oxide microparticle layer densely filled with conductive oxide microparticles was observed.

Example 3

A film was produced in the same manner as in Example 1, except that, in the baking using the hot plate in Example 1, an air (air filled in a cylinder) having a dewpoint of −80° C. or lower was used instead of the air having a dewpoint of −30° C., whereby a transparent conductive film of Example 3 containing indium oxide ($In_2O_3$) as the main component and tin oxide ($SnO_2$) for a dopant was produced.

The various properties of the transparent conductive film produced were measured in the same manner as in Example 1, and the results are shown in Table 1.

Further, when the cross-section of the transparent conductive film of Example 3 was observed with a transmission electron microscope, a conductive oxide microparticle layer that was densely filled with conductive oxide microparticle was observed.

Example 4

A whole surface of a soda-lime glass substrate (10 cm×10 cm×3 mm (thickness)) having a temperature of 25° C. was spin-coated (250 rpm×60 seconds) with the same coating liquid for forming a transparent conductive film as used in Example 1, and then it was dried at 180° C. for 20 minutes. Further, the temperature was elevated to 500° C. for 50 minutes (a rate of temperature elevation: 10° C./minute) under an air atmosphere having a dewpoint of −30° C. (one liter/minute supply), the baking was performed at 500° C. for 15 minutes, only the atmosphere was changed to an air atmosphere having a dewpoint of about 20° C. (one liter/minute supply), and the baking was continued at 500° C. for further 15 minutes, whereby a transparent conductive film of Example 4 having indium oxide ($In_2O_3$) as the main component and tin oxide ($SnO_2$) for a dopant was produced.

Next, the various properties of the surface resistivity, the haze value, the visible-light transmittance, the film thickness, the crystallite size and the pencil hardness of the transparent conductive film produced were measured. The results are shown in Table 1.

Figure 6:
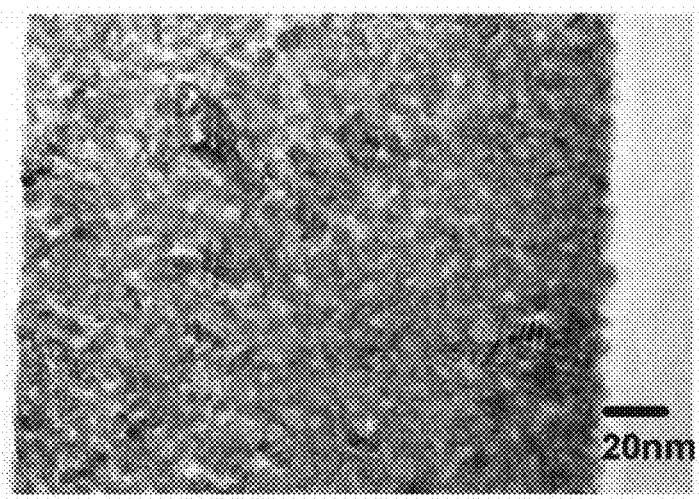
FIG. 6 is a transmission electron micrograph (TEM image) of a cross-section of a transparent conductive film of Example 4.

Furthermore, a transmission electron micrograph (a TEM image) obtained by observing the cross-section of the transparent conductive film of Example 4 with a transmission electron microscope is shown in FIG. 6. A conductive oxide microparticle layer that was densely filled with conductive oxide microparticles was observed.

Example 5

Production of Coating Liquid

Liquid A 9.1 g and liquid B 0.9 g in Example 1 were thoroughly stirred until the mixture was uniform, whereby a coating liquid for forming a transparent conductive film containing the acetylacetone indium and the acetylacetone tin in a total content of 10% by weight, and the hydroxypropyl cellulose in a content of 1% by weight was produced.

Production of Transparent Conductive Film

A whole surface of a soda-lime glass substrate (10 cm×10 cm×3 mm (thickness)) having a temperature of 25° C. was spin-coated (200 rpm×60 seconds) with the resulting coating liquid for forming a transparent conductive film, and after that it was dried at 180° C. for 10 minutes. Further, the temperature was elevated to 500° C. for 50 minutes (a rate of temperature elevation: 10° C./minute) under an air atmosphere having a dewpoint of −16° C., −19° C., −27° C., −34° C., −44° C., or −80° C. (one liter/minute supply), baking was performed at 500° C. for 15 minutes, only the atmosphere was changed into an atmosphere of 1% hydrogen-99% nitrogen (one liter/minute supply), and the baking was continued at 500° C. for further 15 minutes, whereby transparent conductive films of Example 5 containing indium oxide ($In_2O_3$) as the main component and containing tin oxide ($SnO_2$) for a dopant were produced.

The air atmospheres having a dewpoint within the range of −16° C. to −80° C. were obtained by supplying an air having a dewpoint of 25° C. and an air having a dewpoint of −80° C. in predetermined flow rates, and thoroughly mixing them.

Figure 7:
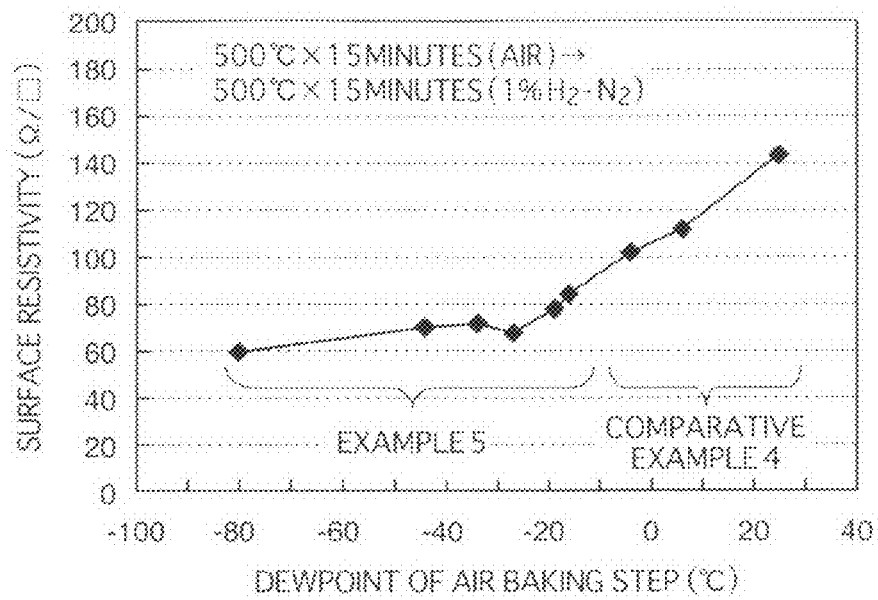
FIG. 7 is a chart showing surface resistivities of transparent conductive films of Example 5 and Comparative Example 4.
Figure 8:
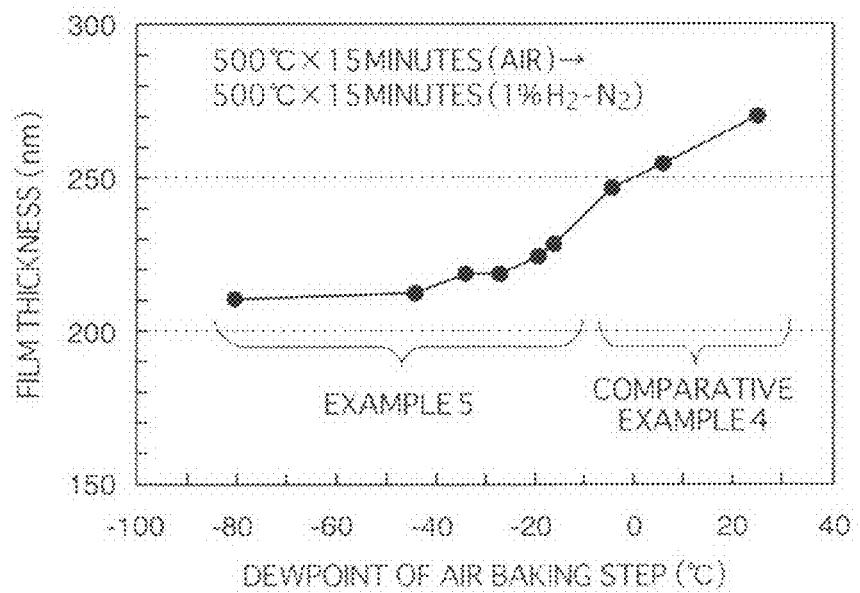
FIG. 8 is a chart showing thicknesses of transparent conductive films of Example 5 and Comparative Example 4.
Figure 9:
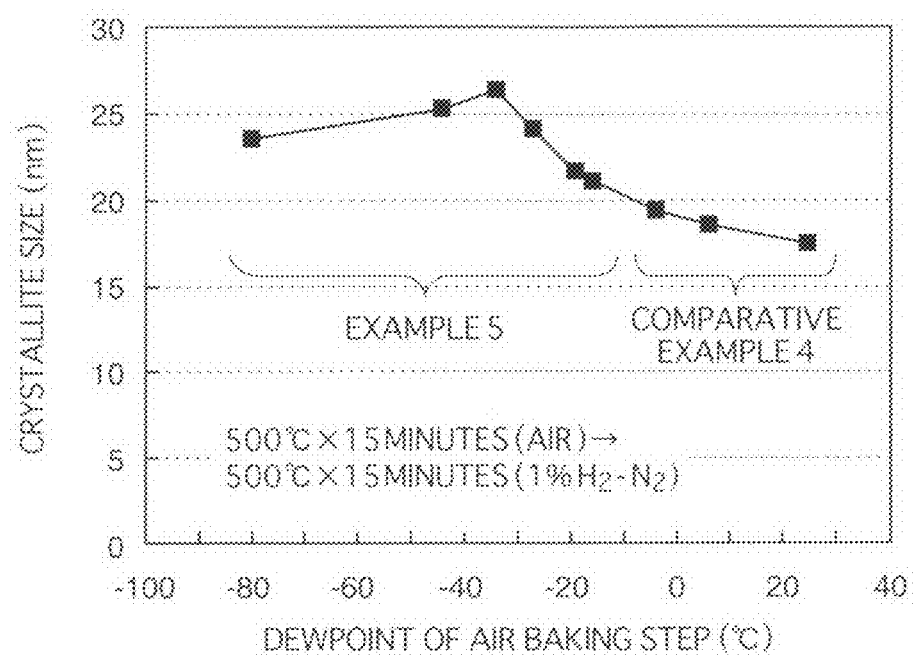
FIG. 9 is a chart showing crystallite sizes of transparent conductive films of Example 5 and Comparative Example 4.

Next, the various properties of the surface resistivity, the film thickness and the crystallite size of the transparent conductive films produced were measured, and the results are shown in FIG. 7, FIG. 8 and FIG. 9, respectively.

The transparent conductive films of Example 5 had high transparency (the haze values were within a range of 0.15 to 0.3%; and the visible-light transmittances were within a range of 92.6 to 95.5%), and all of the transparent conductive films had high pencil hardness, such as 5H or more.

When the cross-sections of the transparent conductive films of Example 5 were observed with a transmission electron microscope, conductive oxide microparticle layers that were densely filled with conductive oxide microparticles were observed.

Example 6

Production of Coating Liquid

Acetylacetone tin (a full name: di-n-butyl bis(2,4-pentanedionato)tin [$Sn(C_4H_9)_2(C_5H_7O_2)_2$] (a molecular weight=431.14) 9.9 g, antimony (III)-n-butoxide [$Sb(C_4H_9O)_3$] (a molecular weight=341.08) 0.1 g, p-tert-butyl phenol 10.5 g, a dibasic acid ester (manufactured by DuPont Japan Limited) 3.5 g, hydroxypropyl cellulose (HPC) 1 g and acetylacetone 75 g were mixed, and the mixture was heated at 120° C. for 120 minutes with stirring to thoroughly dissolve them until the mixture was uniform, whereby a coating liquid for forming a transparent conductive film containing the acetylacetone tin and the antimony (III)-n-butoxide in a total content of 10% by weight, and the hydroxypropyl cellulose in a content of 1% by weight was produced.

Production of Transparent Conductive Film

A whole surface of a soda-lime glass substrate (10 cm×10 cm×3 mm (thickness); a haze value=0.26%, a visible-light transmittance=91.1%) having a temperature of 25° C. was spin-coated (250 rpm×60 seconds) with the resulting coating liquid for forming a transparent conductive film, and after that it was dried at 180° C. for 10 minutes by using a hot air drier. Further, the temperature was elevated to 500° C. for 50 minutes (a rate of temperature elevation: 10° C./minute) using a hot plate under an air atmosphere having a dewpoint of −60° C. (one liter/minute supply), baking was performed at 500° C. for 15 minutes, only the atmosphere was changed into an atmosphere of 1% hydrogen-99% nitrogen (one liter/minute supply), and the baking was continued at 500° C. for further 15 minutes, whereby a transparent conductive film of Example 6 containing tin oxide ($SnO_2$) as the main component and containing antimony oxide for a dopant was produced.

Next, the various properties of the surface resistivity, the haze value, the visible-light transmittance, the film thickness, the crystallite size and the pencil hardness of the transparent conductive film produced were measured, and the results are shown in Table 1.

Figure 10:
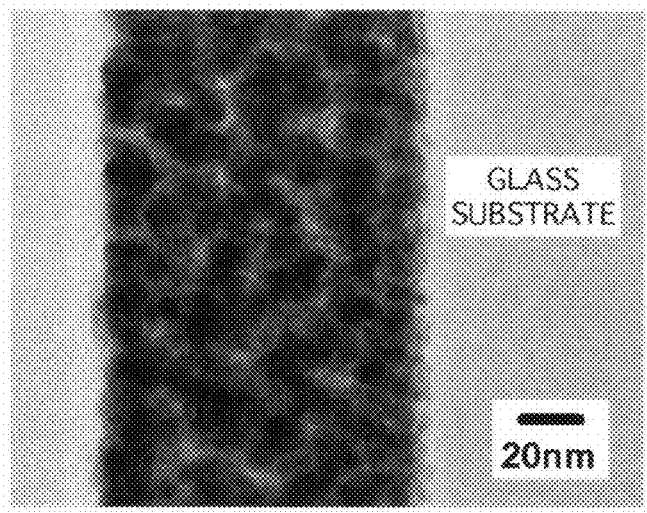
FIG. 10 is a transmission electron micrograph (TEM image) of a cross-section of a transparent conductive film of Example 6.

Further, a transmission electron micrograph (a TEM image) of the cross-section of the transparent conductive film of Example 6 obtained by observing a transmission electron microscope is shown in FIG. 10. A conductive oxide microparticle layer that was densely filled with conductive oxide microparticles was observed.

Example 7

Production of Solution, Liquid C

Acetylacetone zinc (a full name: zinc-2,4-pentanedionate) [$Zn(C_5H_7O_2)_2$] (a molecular weight=263.59) 10 g, γ-butyrolactone 49.99 g, acetylacetone 38 g, hydroxypropyl cellulose (HPC) 2 g and a surfactant 0.01 g were mixed, and the mixture was stirred for 90 minutes with heating at 120° C. until the mixture was uniform, whereby a solution (liquid C) containing the acetylacetone zinc and the hydroxypropyl cellulose was produced.

Production of Solution, Liquid D

Acetylacetone aluminum (a full name: aluminum 2,4-pentanedionate) [$Al(C_5H_7O_2)_3$] (a molecular weight=324.29) 10 g, p-tert-butyl phenol 28.5 g, a dibasic acid ester (manufactured by DuPont Japan Limited) 9.5 g, acetylacetone 49.99 g, hydroxypropyl cellulose (HPC) 2 g and a surfactant 0.01 g were mixed, and the mixture was stirred for 90 minutes with heating at 120° C. until the mixture was uniform, whereby a solution (liquid D) containing the acetylacetone aluminum and the hydroxypropyl cellulose was produced.

Production of Coating Liquid

Produced liquid C 9.5 g and liquid D 0.5 g were thoroughly stirred until the mixture was uniform, whereby a coating liquid for forming a transparent conductive film containing the acetylacetone zinc and the acetylacetone aluminum in a total content of 10% by weight, and the hydroxypropyl cellulose in a content of 2% by weight was produced.

Production of Transparent Conductive Film

A whole surface of a soda-lime glass substrate (10 cm×10 cm×3 mm (thickness); a haze value=0.26%, a visible-light transmittance=91.1%) having a temperature of 25° C. was spin-coated (250 rpm×60 seconds) with the resulting coating liquid for forming a transparent conductive film, and after that it was dried at 180° C. for 10 minutes by using a hot air drier. Further, the temperature was elevated to 500° C. for 50 minutes (a rate of temperature elevation: 10° C./minute) using a hot plate under an air atmosphere having a dewpoint of −60° C. (one liter/minute supply), baking was performed at 500° C. for 15 minutes, only the atmosphere was changed into an atmosphere of 1% hydrogen-99% nitrogen (one liter/minute supply), and the baking was continued at 500° C. for further 15 minutes, whereby a transparent conductive film of Example 7 containing zinc oxide (ZnO) as the main component and aluminum oxide ($Al_2O_3$) for a dopant was produced.

Next, the various properties of the surface resistivity, the haze value, the visible-light transmittance, the film thickness, the crystallite size and the pencil hardness of the transparent conductive film produced were measured, and the results are shown in Table 1.

Figure 11:
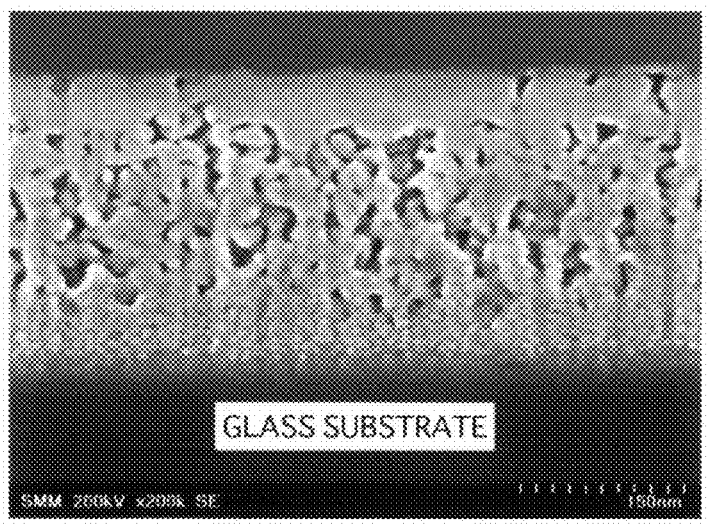
FIG. 11 is a scanning electron micrograph (SEM image) of a cross-section of a transparent conductive film of Example 7.

Further, a scanning electron micrograph (a SEM image) obtained by observing the cross-section of the transparent conductive film of Example 7 with a transmission electron microscope is shown in FIG. 11. A conductive oxide microparticle layer that was densely filled with conductive oxide microparticles was observed.

Comparative Example 1

A film was produced in the same manner as in Example 1, except that an air having a dewpoint of 15° C. was used instead of the air having a dewpoint of −30° C. used in Example 1, whereby a transparent conductive film of Comparative Example 1 containing indium oxide ($In_2O_3$) as the main component and tin oxide ($SnO_2$) for a dopant.

The various properties of the transparent conductive film produced were measured in the same manner as in Example 1, and the results are shown in Table 1.

Figure 12:
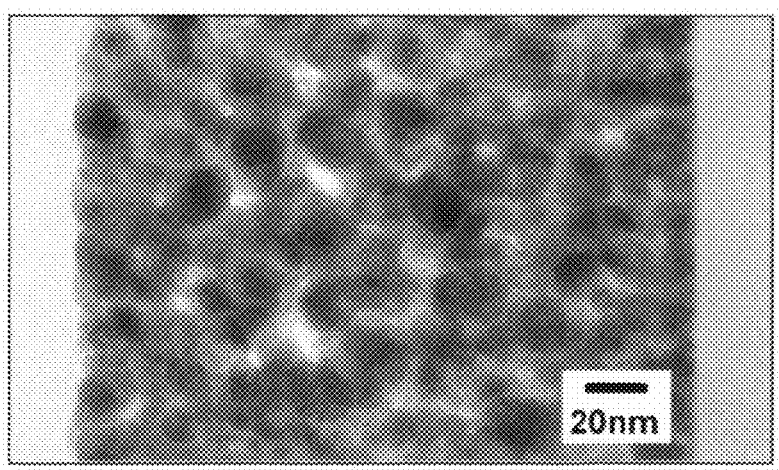
FIG. 12 is a transmission electron micrograph (TEM image) of a cross-section of a transparent conductive film of Comparative Example 1.
Figure 13:
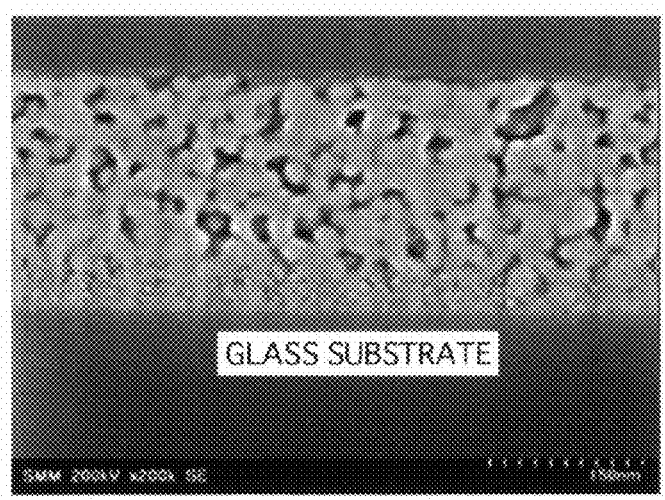
FIG. 13 is a scanning electron micrograph (SEM image) of a cross-section of a transparent conductive film of Comparative Example 1.

Further, a transmission electron micrograph (a TEM image) and a scanning electron micrograph (a SEM image), obtained by observing the cross-section of the transparent conductive film of Comparative Example 1 with a transmission electron microscope, are respectively shown in FIG. 12 and FIG. 13. A conductive oxide microparticle layer in which there were pores between conductive oxide microparticles was observed.

Comparative Example 2

A film was produced in the same manner as in Example 2, except that an air having a dewpoint of 15° C. was used instead of the air having a dewpoint of −30° C. used in Example 2, whereby a transparent conductive film of Comparative Example 2 containing indium oxide ($In_2O_3$) as the main component and tin oxide ($SnO_2$) for a dopant was produced.

The various properties of the transparent conductive film produced were measured in the same manner as in Example 1, and the results are shown in Table 1.

Figure 14:
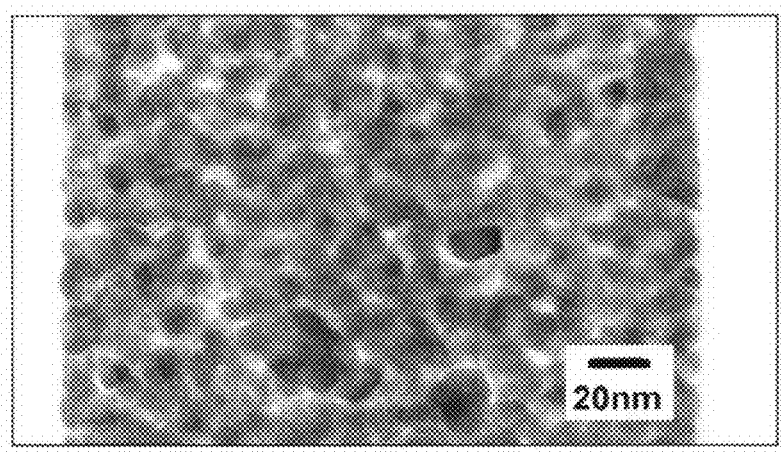
FIG. 14 is a transmission electron micrograph (TEM image) of a cross-section of a transparent conductive film of Comparative Example 2.
Figure 15:
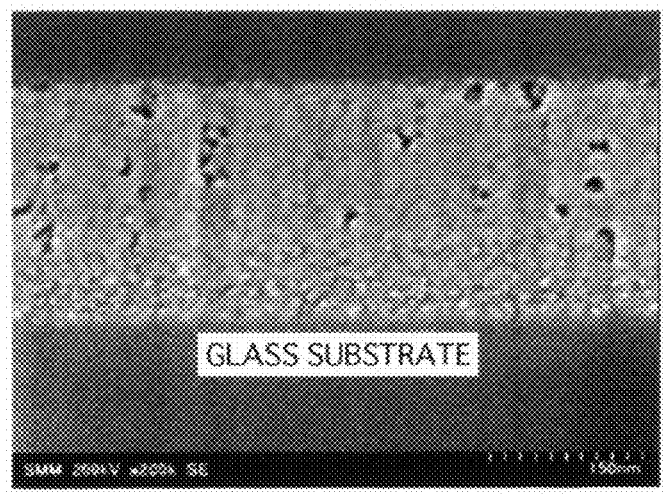
FIG. 15 is a scanning electron micrograph (SEM image) of a cross-section of a transparent conductive film of Comparative Example 2.

Furthermore, a transmission electron micrograph (a TEM image) and a scanning electron micrograph (a SEM image), obtained by observing the cross-section of the transparent conductive film of Comparative Example 2 with a transmission electron microscope, are respectively shown in FIG. 14 and FIG. 15. A conductive oxide microparticle layer in which there were pores between conductive oxide microparticles was observed.

Comparative Example 3

A film was produced in the same manner as in Example 4, except that an air having a dewpoint of about 20° C. was used instead of the air having a dewpoint of −30° C. used in Example 4 (that is, the temperature was elevated to 500° C. for 50 minutes (a rate of temperature elevation: 10° C./minute) under an air atmosphere having a dewpoint about 20° C. (one liter/minute supply), and the baking was performed at 500° C. for 30 minutes as it was), whereby a transparent conductive film of Comparative Example 3 containing indium oxide ($In_2O_3$) as the main component and tin oxide ($SnO_2$) for a dopant was produced.

The various properties of the transparent conductive film produced were measured in the same manner as in Example 1, and the results are shown in Table 1.

Figure 16:
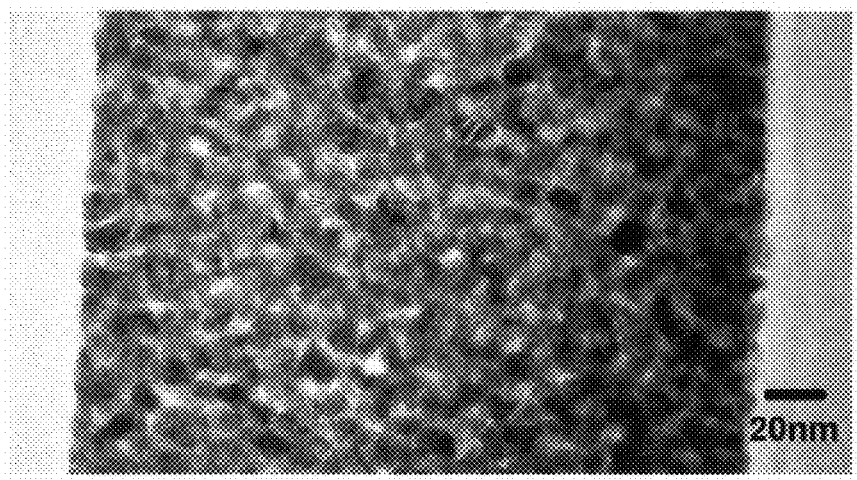
FIG. 16 is a transmission electron micrograph (TEM image) of a cross-section of a transparent conductive film of Comparative Example 3.

Further, a transmission electron micrograph (a TEM image), obtained by observing the cross-section of the transparent conductive film of Comparative Example 3 with a transmission electron microscope is shown in FIG. 16. A conductive oxide microparticle layer in which there were pores between conductive oxide microparticles was observed.

Comparative Example 4

A film was produced in the same manner as in Example 5, except that an air having a dewpoint of 25° C., 6° C. or −4° C. was used instead of the air having the dewpoint within the range of −16° C. to −80° C. used in Example 5, whereby various transparent conductive films of Comparative Example 4 having indium oxide ($In_2O_3$) as the main component and tin oxide ($SnO_2$) for a dopant were produced.

The air atmospheres having a dewpoint of 25° C., 6° C. or −4° C. were obtained by supplying the air having a dewpoint of 25° C. and the air having a dewpoint −80° C. in predetermined flow rates, and thoroughly mixing them.

Next, the various properties of the surface resistivity, the film thickness and the crystallite size of the various transparent conductive films produced were measured, and the results are shown in FIG. 7, FIG. 8, and FIG. 9, respectively.

The various transparent conductive films of Comparative Example 4 had high transparencies (the haze values were within a range of 0.1 to 0.3%; and the visible-light transmittances were within a range of 92.3 to 98.7%), but all of the transparent conductive films had insufficient pencil hardness, such as less than 3H.

When the cross-sections of the transparent conductive films of Comparative Example 4 were observed with a transmission electron microscope, conductive oxide microparticle layers in which there were pores between conductive oxide microparticles were observed.

Comparative Example 5

A film was produced in the same manner as in Example 6, except that an air having a dewpoint of 23° C. was used instead of the air having a dewpoint of −60° C. used in Example 6, whereby a transparent conductive film of Comparative Example 5 containing tin oxide ($SnO_2$) as the main component and antimony oxide for a dopant was produced.

The various properties of the transparent conductive film produced were measured in the same manner as in Example 1, and the results are shown in Table 1.

Figure 17:
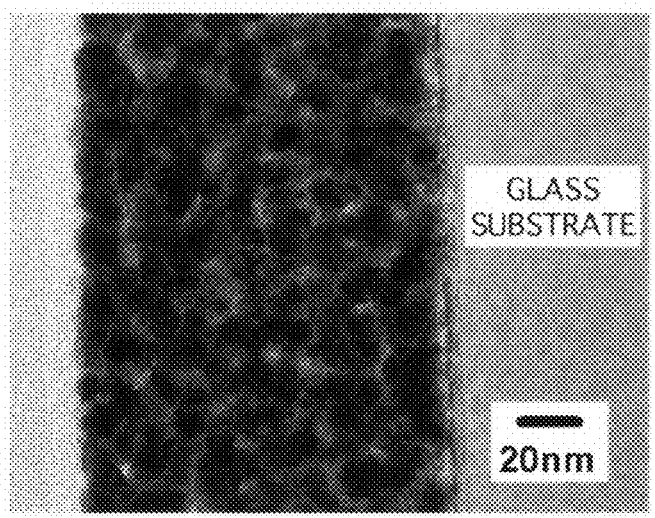
FIG. 17 is a transmission electron micrograph (TEM image) of a cross-section of a transparent conductive film of Comparative Example 5.

Moreover, a transmission electron micrograph (a TEM image), obtained by observing the cross-section of the transparent conductive film of Comparative Example 5 with a transmission electron microscope is shown in FIG. 17. A conductive oxide microparticle layer in which there were pores between conductive oxide microparticles was observed.

Comparative Example 6

A film was produced in the same manner as in Example 7, except that an air having a dewpoint of 23° C. was used instead of the air having a dewpoint of −60° C. used in Example 7, whereby a transparent conductive film of Comparative Example 6 containing zinc oxide (ZnO) as the main component and aluminum oxide ($Al_2O_3$) for a dopant was produced.

The various properties of the transparent conductive film produced were measured in the same manner as in Example 1, and the results are shown in Table 1.

Figure 18:
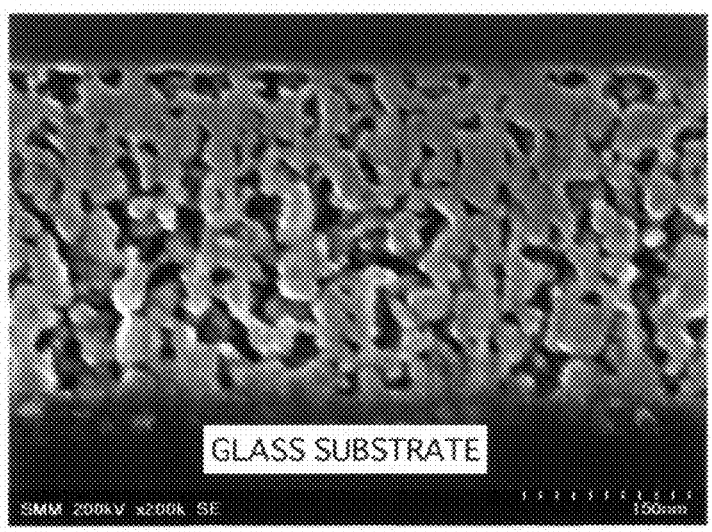
FIG. 18 is a scanning electron micrograph (SEM image) of a cross-section of a transparent conductive film of Comparative Example 6.

Furthermore, a scanning electron micrograph (a SEM image), obtained by observing the cross-section of the transparent conductive film of Comparative Example 6 with a transmission electron microscope, is shown in FIG. 18. A conductive oxide microparticle layer in which there were pores between conductive oxide microparticles was observed.

TABLE 1

|  | Surface resistivity [Ω/□] | Haze value | Visible-light transmittance [%] | Film thickness [nm] | Crystallite size [nm] | Pencil hardness |
| --- | --- | --- | --- | --- | --- | --- |
| Ex. 1 | 55 | 0.14 | 95.5 | 190 | 28.6 | 5H or more |
| Ex. 2 | 140 | 0.15 | 97.7 | 205 | 21.1 | 5H or more |
| Ex. 3 | 50 | 0.13 | 95.2 | 190 | 29.5 | 5H or more |
| Ex. 4 | 660 | 0.14 | 93.3 | 185 | 17.0 | 5H or more |
| Ex. 6 | 7500 | 0.29 | 96.9 | 105 | 8.5 | 5H or more |
| Ex. 7 | $2 \times 10^4$ | 1.00 | 92.7 | 240 | 27.9 | 3H |
| Com. Ex. 1 | 150 | 0.12 | 98.0 | 225 | 19.0 | less than H |
| Com. Ex. 2 | 440 | 0.14 | 98.8 | 225 | 15.0 | less than H |
| Com. Ex. 3 | 1540 | 0.14 | 97.0 | 230 | 13.5 | less than H |
| Com. Ex. 5 | $6 \times 10^6$ | 0.46 | 98.5 | 115 | <3.0 | less than H |
| Com. Ex. 6 | $8 \times 10^6$ | 0.25 | 99.8 | 310 | 15.8 | less than H |

When Examples are compared with Comparative Examples as described above (comparison of Examples 1 and 3 with Comparative Example 1; comparison of Example 2 with Comparative Example 2; comparison of Example 4 with Comparative Example 3; comparison of Example 5 with Comparative Example 4; comparison of Example 6 with Comparative Example 5; and comparison of Example 7 with Comparative Example 6), it is understood that, in each Example, the crystal growth proceeds (the crystallite size is large), the transparent conductive film has the conductive oxide microparticle layer densely filled with the conductive oxide microparticles, and the film strength (the pencil hardness) is high; whereas, in each Comparative Example, the crystal growth does not proceed (the crystallite size is small), the transparent conductive film has the conductive oxide microparticle layer in which there are pores between the conductive oxide microparticles, and the film strength (the pencil hardness) is remarkably low.

Also, when Example 1 and Example 3 are compared with Comparative Example 1, it is understood that although all of the transparent conductive films were obtained by baking at 500° C. (the air atmosphere and the 2% hydrogen-98% nitrogen atmosphere), low resistance values of 50 to 55Ω/☐ (which is read as "ohm per square") can be obtained in Example 1 and Example 3, whereas the relatively high resistance values of 150Ω/☐ are obtained in Comparative Example 1.

In addition, the film thickness in Example 1 and Example 3 is 190 nm, whereas the film thickness in Comparative Example 1 is 225 nm, which is about 18% thicker. From this point, the transparent conductive films of Example 1 and Example 3 are about 18% more densified than the transparent conductive film of Comparative Example 1.

When Example 2 is compared with Comparative Example 2, it is understood that although both of the transparent conductive films are obtained by baking at 350° C. (the air atmosphere and the 2% hydrogen-98% nitrogen atmosphere), the low resistance value of 140Ω/☐ can be obtained in Example 2, whereas the high resistance value of 440Ω/☐ is obtained in Comparative Example 2.

In addition, the film thickness in Example 2 is 205 nm, whereas the film thickness in Comparative Example 2 is 225 nm, which is about 10% thicker. From this point, the transparent conductive film of Example 2 is about 10% more densified than the transparent conductive film of Comparative Example 2.

When Example 4 is compared with Comparative Example 3, it is understood that although both of the transparent conductive films are obtained by baking at 500° C. (the air atmosphere), the resistance value of 660Ω/☐ can be obtained in Example 4, whereas the high resistance value of 1540Ω/☐ is obtained in Comparative Example 3.

In addition, the film thickness in Example 4 is 185 nm, whereas the film thickness in Comparative Example 3 is 230 nm, which is about 24% thicker. From this point, the transparent conductive film of Example 4 is about 24% more densified than the transparent conductive film of Comparative Example 3.

When Example 5 is compared with Comparative Example 4, it is understood from FIG. 7 to FIG. 9 that although all of the transparent conductive films are obtained by baking at 500° C. (the air atmosphere), the various transparent conductive films in Example 5 have resistance values of 84Ω/☐ or lower, whereas the various transparent conductive films in Comparative Example 4 have resistance values of 102Ω/☐ or higher.

In addition, the various transparent conductive films in Example 5 have film thicknesses of 228 nm or less, whereas the various transparent conductive films in Comparative Example 4 are thicker such as film thicknesses of 246 nm or more. From this point, it is understood that the various transparent conductive films in Example 5 are more densified than the various transparent conductive films in Comparative Example 4.

When Example 6 is compared with Comparative Example 5, it is understood that although both of the transparent conductive films are obtained by baking at 500° C. (the air atmosphere and the 1% hydrogen-99% nitrogen atmosphere), the resistance value of 7500Ω/☐ can be obtained in Example 6, whereas the very high resistance value of $6 \times 10^6 \Omega/☐$ is obtained in Comparative Example 5.

In addition, the film thickness in Example 6 is 105 nm, whereas the film thickness in Comparative Example 5 is 115 nm, which is about 10% thicker. From this point, the transparent conductive film of Example 6 is about 10% more densified than the transparent conductive film of Comparative Example 5.

When Example 7 is compared with Comparative Example 6, it is understood that although both of the transparent conductive films are obtained by baking at 500° C. (the air atmosphere and the 1% hydrogen-99% nitrogen atmosphere), the resistance value of 20 kΩ/☐ can be obtained in Example 7, whereas the very high resistance value of $8 \times 10^6 \Omega/☐$ is obtained in Comparative Example 6.

In addition, the film thickness in Example 7 is 240 nm, whereas the film thickness in Comparative Example 6 is 310 nm, which is about 30% thicker. From this point, the transparent conductive film of Example 7 is about 30% more densified than the transparent conductive film of Comparative Example 6.

INDUSTRIAL APPLICABILITY

The transparent conductive film according to the present invention can be formed on a heat-resistant substrate using various inexpensive coating methods. The obtained transparent conductive film has both the excellent transparency and the high conductivity, and further has the high film strength. As a result, the transparent conductive substrate in which the transparent conductive film is formed on the heat-resistant substrate can be expected to be utilized for transparent electrodes in light emitting devices such as an LED element, an electroluminescent lamp (an electroluminescent element) or a field emission lamp; electric power-generating devices such as a solar cell; display devices such as a liquid crystal display, an electroluminescent display (an electroluminescent element), a plasma display or an electronic paper element; of inputting devices such as a touch panel.

The invention claimed is:

1. A method for producing a transparent conductive film, comprising the steps of:
   (a) coating a heat-resistant substrate with a coating liquid to form a transparent conductive coating film containing an organic metal compound as a main component;
   (b) drying the transparent conductive coating film to form a dried coating film;
   (c) baking the dried coating film obtained in step (b) to form an inorganic film containing an inorganic component comprising a metal oxide as a main component by heating to at least a baking temperature at which at least the inorganic component is crystallized in an oxygen-containing atmosphere having a dewpoint of −10° C. or lower, whereby an organic component contained in the dried coating film is removed therefrom by heat decomposition, combustion or a combination thereof, to thereby form a conductive oxide microparticle layer densely filled with conductive oxide microparticles containing the metal oxide as a main component; wherein the organic metal compound comprises at least one compound selected from the group consisting of organic indium compounds, organic tin compounds and organic zinc compounds, and wherein the metal oxide consists of at least one oxide selected from the group consisting of indium oxide, tin oxide and zinc oxide, and (d) subsequent to step (c) baking at a temperature of 300° C. or higher under an oxygen-containing atmosphere having a dewpoint of 0° C. or higher.

2. The method for producing a transparent conductive film according to claim 1, wherein the organic indium compound consists of acetylacetone indium.

3. The method for producing a transparent conductive film according to claim 1, including subsequent to step (d), a step (e) of baking at a temperature of 250° C. or higher under a neutral atmosphere or a reducing atmosphere.

4. The method for producing a transparent conductive film according to claim 1, wherein the dewpoint in step (c) is −20° C. or lower.

5. The method for producing a transparent conductive film according to claim 1, wherein step (a) comprises an ink jet printing method, a screen printing method, a gravure printing method, an offset printing method, a flexo printing method, a dispenser printing method, a slit coating method, a die coating method, a doctor blade coating method, a wire bar coating method, a spin coating method, a dip coating method and a spray coating method.

6. A method for producing a transparent conductive film, comprising the steps of:
(a) coating a heat-resistant substrate with a coating liquid to form a transparent conductive coating film containing an organic metal compound as a main component and an organic metal compound as a dopant;
(b) drying the transparent conductive coating film to form a dried coating film;
(c) baking the dried coating film obtained in step (b) to form an inorganic film containing an inorganic component comprising a metal oxide containing a dopant metal compound as a main component by heating to at least a baking temperature at which at least the inorganic component is crystallized in an oxygen-containing atmosphere having a dewpoint of −10° C. or lower, whereby an organic component contained in the dried coating film is removed therefrom by heat decomposition, combustion or a combination thereof to thereby form a conductive oxide microparticle layer densely filled with conductive oxide microparticles containing the metal oxide as a main component and the dopant metal compound, wherein the organic metal compound comprises of at least one compound selected from the group consisting of organic indium compounds, organic tin compounds and organic zinc compounds, and wherein the metal oxide consists of at least one member of the oxides selected from indium oxide, tin oxide and zinc oxide, and (d) subsequent to step (c) baking at a temperature of 300° C. or higher under an oxygen-containing atmosphere having a dewpoint of 0° C. or higher.

7. The method for producing a transparent conductive film according to claim 6, wherein content ratio of the organic metal compound and the organic metal compound as a dopant is within a molar ratio range of 99.9:0.1 to 66.7:33.3.

8. The method for producing a transparent conductive film according to claim 6, wherein the organic metal compound consists of the organic indium compound; and
the organic metal compound as a dopant is at least one compound selected from the group consisting of organic tin compounds, organic titanium compounds, organic germanium compounds, organic zinc compounds, organic tungsten compounds, organic zirconium compounds, organic tantalum compounds, organic niobium compounds, organic hafnium compounds and organic vanadium compounds; and the dopant metal compound is any one or more of tin oxide, titanium oxide, germanium oxide, zinc oxide, tungsten oxide, zirconium oxide, tantalum oxide, niobium oxide, hafnium oxide and vanadium oxide.

9. The method for producing a transparent conductive film according to claim 6, wherein the organic metal compound consists of the organic tin compound; and the organic metal compound for a dopant is at least one compound selected from the group consisting of organic indium compounds, organic antimony compounds and organic phosphorous compounds.

10. The method for producing a transparent conductive film according to claim 6, wherein the organic metal compound consists of the organic zinc compound; and the organic metal compound as a dopant is at least one compound selected from the group consisting of organic aluminum compounds, organic indium compounds and organic gallium compounds.

* * * * *